US 9,997,349 B2

(12) United States Patent
Iwahata et al.

(10) Patent No.: US 9,997,349 B2
(45) Date of Patent: Jun. 12, 2018

(54) SUBSTRATE PROCESSING METHOD AND SUBSTRATE PROCESSING APPARATUS

(71) Applicant: SCREEN Holdings Co., Ltd., Kyoto (JP)

(72) Inventors: Shota Iwahata, Kyoto (JP); Masayuki Otsuji, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days. days.

(21) Appl. No.: 15/170,055

(22) Filed: Jun. 1, 2016

(65) Prior Publication Data
US 2016/0365238 A1 Dec. 15, 2016

(30) Foreign Application Priority Data

Jun. 10, 2015 (JP) .................. 2015-117557

(51) Int. Cl.
*H01L 21/02* (2006.01)
*H01L 21/67* (2006.01)
*H01L 21/306* (2006.01)
*B81C 1/00* (2006.01)

(52) U.S. Cl.
CPC .... *H01L 21/0206* (2013.01); *H01L 21/30604* (2013.01); *H01L 21/67028* (2013.01); *H01L 21/67051* (2013.01); *B81C 1/00928* (2013.01); *H01L 21/02063* (2013.01)

(58) Field of Classification Search
CPC ........... H01L 21/0206; H01L 21/06063; H01L 21/30604; H01L 21/67028; H01L 21/67051; B81C 1/00928
See application file for complete search history.

(56) References Cited

U.S. PATENT DOCUMENTS

| 5,271,774 A | * | 12/1993 | Leenaars | F26B 5/08 134/31 |
| 5,882,433 A | | 3/1999 | Ueno | 134/31 |
| 8,070,884 B2 | * | 12/2011 | Gast | H01L 21/02063 134/18 |
| 2005/0145267 A1 | * | 7/2005 | Korolik | H01L 21/67028 134/30 |
| 2008/0092929 A1 | | 4/2008 | Yokouchi | 134/30 |
| 2011/0155177 A1 | * | 6/2011 | Tamura | H01L 21/02057 134/18 |

(Continued)

FOREIGN PATENT DOCUMENTS

KR  10-2008-0035973 A  4/2008

*Primary Examiner* — Anita K Alanko
(74) *Attorney, Agent, or Firm* — Ostrolenk Faber LLP

(57) ABSTRACT

A substrate processing method includes a liquid film forming step of forming a liquid film of an organic solvent with which a whole area of an upper surface of a substrate is covered in order to replace a processing liquid existing on the upper surface with an organic solvent liquid, a thin film holding step of thinning the liquid film of the organic solvent by rotating the substrate at a first high rotational speed while keeping surroundings of the whole area of the upper surface in an atmosphere of an organic solvent vapor and holding a resulting thin film of the organic solvent on the upper surface, and a thin-film removing step of removing the thin film from the upper surface after the thin film holding step, and the thin-film removing step includes a high-speed rotation step of rotating the substrate at a second high rotational speed.

10 Claims, 12 Drawing Sheets

(56) References Cited

U.S. PATENT DOCUMENTS

2014/0127908 A1\* 5/2014 Okutani ............ H01L 21/02068
  438/694
2016/0025409 A1\* 1/2016 Miyazaki .................. F26B 3/28
  34/274

\* cited by examiner

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus for processing substrates. Examples of substrates to be processed include semiconductor wafers, substrates for liquid crystal displays, substrates for plasma displays, substrates for FEDs (Field Emission Displays), substrates for optical disks, substrates for magnetic disks, substrates for magneto-optical disks, substrates for photomasks, ceramic substrates, and substrates for solar cells.

2. Description of Related Art

In steps of manufacturing a semiconductor device, a front surface of a substrate, such as a semiconductor wafer, is processed by a processing liquid. A single substrate processing type apparatus that processes substrates one by one includes a spin chuck that rotates a substrate while holding the substrate substantially horizontally and a nozzle that supplies a processing liquid to the front surface of the substrate rotated by the spin chuck.

In a typical substrate processing step, a chemical liquid is supplied to the substrate held by the spin chuck. Thereafter, a rinsing liquid is supplied to the substrate, and, as a result, the chemical liquid on the substrate is replaced with the rinsing liquid. Thereafter, a spin drying step to exclude the rinsing liquid on the substrate is performed. In the spin drying step, the substrate is rotated at a high speed, and, as a result, the rinsing liquid adhering to the substrate is spun off and is removed (dried). A generally-used rinsing liquid is deionized water.

If a fine pattern is formed on the front surface of the substrate, there is a fear that it will be impossible to remove the rinsing liquid that has entered the inside of the pattern in the spin drying step, and hence there is a fear that defects in drying will occur. Therefore, as is disclosed by U.S. Pat. No. 5,882,433 A, a technique has been proposed in which an organic solvent liquid, such as isopropyl alcohol (IPA), is supplied to the front surface of the substrate that has already been processed by the rinsing liquid, and then the front surface of the substrate is dried by replacing the rinsing liquid that has entered gaps of the pattern of the front surface of the substrate with the organic solvent liquid.

SUMMARY OF THE INVENTION

In the spin drying step in which the substrate is dried by rotating the substrate at a high speed, a liquid surface of the organic solvent (interface between air and the liquid) is formed in a pattern. The surface tension of the liquid acts on a contact position between the liquid surface and the pattern.

As shown in FIG. 9, the liquid surface height H of the organic solvent that has entered gaps of a pattern P is nonuniform at different parts of a substrate W. This is caused by the following reason. In detail, in the spin drying step, the upper surface of the substrate W is dried not only by spining off a liquid by means of a centrifugal force generated in response to the high-speed rotation of the substrate W but also by evaporating an organic solvent liquid (diffusing an organic solvent vapor) that adheres to the upper surface of the substrate W. The peripheral speed of the upper surface of the substrate W becomes higher in proportion to an approach to the peripheral edge of the upper surface of the substrate W, and therefore, in the spin drying step, an opportunity to come into contact with fresh air increases, and the evaporation speed of the organic solvent liquid becomes higher in proportion to an approach to the peripheral edge of the front surface of the substrate W. Therefore, when the substrate is dried, a state (see FIG. 9) is temporarily generated in which the liquid surface height H inside the pattern P becomes lower in proportion to an approach to the peripheral edge of the upper surface of the substrate W.

As shown in FIG. 9, when the liquid surface height H is nonuniform at different parts of the substrate W, the liquid surface height H of the organic solvent that is present around a structural element P1 of the pattern P varies with respect to the entire periphery of the structural element P1. Therefore, the surface tension (capillary force) of the organic solvent liquid that acts on the structural element P1 does not balance with respect to the entire periphery of the structural element P1, and the structural element P1 falls in a direction in which high surface tension acts. In other words, the present inventors consider that nonuniformity in the liquid surface height H is a possible cause for which the pattern P collapses.

In this case, if a period of time required to remove the organic solvent liquid becomes long, the collapse of the pattern P will be furthered. The reason is that an impulse that acts on each structural element becomes large when an unbalanced state of the surface tension acting on the structural element P1 continues for a long time.

When the organic solvent liquid is supplied to the substrate prior to the spin drying step as in U.S. Pat. No. 5,882,433 A, the organic solvent liquid enters gaps of the pattern. The surface tension of the organic solvent is lower than that of water that is a typical rinsing liquid. Therefore, the problem of a pattern collapse that results from surface tension is eased.

However, in recent years, a pattern (e.g., convex pattern or linear pattern) that is fine and that has a high aspect ratio has been formed on the front surface of a substrate in order to highly integrate a device (e.g., semiconductor device) produced by use of substrate processing. The pattern that is fine and that has a high aspect ratio is low in strength, and therefore there is a fear that a collapse will be also caused by surface tension that acts on the liquid surface of the organic solvent.

Therefore, it is an object of the present invention to provide a substrate processing method and a substrate processing apparatus that are capable of restraining or preventing the collapse of a pattern.

The present invention provides a substrate processing method that includes a substrate holding step of holding a substrate having an upper surface on which a pattern is formed horizontally by a substrate holding unit, a liquid film forming step of forming a liquid film of an organic solvent with which a whole area of the upper surface is covered in order to replace a processing liquid existing on the upper surface with an organic solvent liquid, a thin film holding step of thinning the liquid film of the organic solvent by rotating the substrate at a first high rotational speed while keeping surroundings of the whole area of the upper surface in an atmosphere of an organic solvent vapor and holding a resulting thin film of the organic solvent on the upper surface, and a thin-film removing step of removing the thin film from the upper surface after the thin film holding step, and the thin-film removing step includes a high-speed rotation step of rotating the substrate at a second high rotational speed.

According to this method, a liquid film of an organic solvent with which a whole area of the upper surface is covered is formed on the upper surface of the substrate, and thereafter the substrate is rotated at a high speed while keeping the surroundings of the whole area of the upper surface in an atmosphere of an organic solvent vapor. Most of the organic solvent liquid on the upper surface of the substrate is spun off by the high-speed rotation of the substrate. Therefore, most of the organic solvent liquid included in the liquid film of the organic solvent is discharged outwardly from the substrate, and the liquid film of the organic solvent is thinned. However, the surroundings of the entire upper surface of the substrate are kept in the atmosphere of the organic solvent vapor, and therefore the diffusion of the organic solvent vapor is not advanced, and, as a result, the evaporation of the organic solvent liquid is restrained or prevented from being advanced in the upper surface of the substrate. This makes it impossible to remove all of the organic solvent liquid forming the liquid film of the organic solvent, and the thin film of the organic solvent with which the whole area of the upper surface is covered is held on the upper surface of the substrate.

Additionally, the surroundings of the entire upper surface of the substrate are kept in the atmosphere of the organic solvent vapor, and therefore the diffusion of the organic solvent vapor is restrained from being advanced in the whole area of the upper surface of the substrate, and, as a result, it is possible to keep the thin film of the organic solvent uniform in thickness in the whole area of the upper surface of the substrate. Thereafter, the thin film of the organic solvent is removed from the upper surface of the substrate. In other words, the organic solvent liquid is removed from a gap of the inside of the pattern.

The liquid film of the organic solvent is temporarily thinned so as to be the thin film having a uniform, small thickness, and then the removal of the organic solvent liquid is started, and therefore it is possible to remove the organic solvent liquid from the upper surface of the substrate while maintaining a state in which the liquid surface height of the organic solvent that has entered the gap of the inside of the pattern does not vary in the substrate surface. This makes it possible to restrain or prevent the pattern from being collapsed.

In one preferred embodiment of the present invention, the substrate holding unit is accommodated in an internal space of a seal chamber that is sealed up from an outside, and the thin film holding step is performed in a closed state in which the internal space is sealed up from the outside.

According to this method, it is possible to bring the whole area of the internal space of the seal chamber into the atmosphere of the organic solvent vapor by containing the substrate in the internal space of the seal chamber and by bringing the exhaust valve into a closed state. Therefore, it is possible to reliably keep the surroundings of the entire upper surface of the substrate in the atmosphere of the organic solvent vapor. Accordingly, in the organic solvent thin-film holding step, it is possible to reliably stop the evaporation of the organic solvent liquid in the upper surface of the substrate (i.e., the diffusion of the organic solvent vapor in the upper surface of the substrate), and hence is possible to reliably form the thin film of the organic solvent that has a uniform, small thickness on the upper surface of the substrate.

The thin film holding step may be performed in a state of closing an exhaust valve by which the internal space of the seal chamber is exhausted.

According to this method, it is possible to keep the internal space in a closed state by closing the exhaust unit that exhausts the internal space of the seal chamber. This makes it possible to reliably form a thin film of an organic solvent that has a uniform, small thickness on the upper surface of the substrate in the thin film holding step.

The thin-film removing step may further include an opening step of opening the internal space of the seal chamber to the outside.

According to this method, the substrate is rotated at a high speed in a state in which the internal space of the seal chamber is opened to the outside. In a state in which the internal space of the seal chamber is opened to the outside, a fresh gas comes into contact with the upper surface of the substrate, and therefore the diffusion of the organic solvent vapor is advanced at different parts of the upper surface of the substrate, and the evaporation of the organic solvent liquid is advanced at different parts of the upper surface of the substrate. Therefore, it is possible to spin off the organic solvent liquid on the upper surface of the substrate by the high-speed rotation of the substrate, and this makes it possible to dry the upper surface of the substrate.

The thin-film removing step may further include a step of supplying a high-temperature inert gas higher than a room temperature to the upper surface and opening the internal space of the seal chamber to the outside.

According to this method, the internal space of the seal chamber is opened to the outside while supplying a high-temperature inert gas higher than a room temperature to the upper surface of the substrate in a state in which the substrate is being rotated at a high speed. The organic solvent liquid that has entered a gap of the inside of the pattern is evaporated by a high-temperature inert gas. Additionally, a fresh gas comes into contact with the upper surface of the substrate by opening the internal space of the seal chamber to the outside, and therefore the diffusion of the organic solvent vapor is advanced at different parts of the upper surface of the substrate, and the evaporation of the organic solvent liquid is advanced at different parts of the upper surface of the substrate. It is possible to dry the upper surface of the substrate at once by simultaneously performing the supply of a high-temperature inert gas and the outward opening of the internal space in the thin-film removing step.

The thin-film removing step may further include an inert gas supply step of supplying a high-temperature inert gas higher than a room temperature to the upper surface.

According to this method, the substrate is rotated at a high speed while supplying a high-temperature inert gas higher than a room temperature to the upper surface of the substrate. It is possible to spin off the organic solvent liquid on the upper surface of the substrate by the high-speed rotation of the substrate. At this time, the organic solvent liquid that has entered a gap of the inside of the pattern is evaporated by a high-temperature inert gas supplied to the upper surface of the substrate, and therefore it is possible to shorten a period of drying time. This makes it possible to further prevent the pattern from being collapsed.

The thin film holding step may keep the surroundings of the upper surface in an atmosphere of the organic solvent vapor by use of the organic solvent vapor generated by evaporation of the organic solvent liquid supplied to the upper surface in the liquid film forming step.

According to this method, the surroundings of the whole area of the upper surface of the substrate are kept in an atmosphere of the organic solvent vapor by use of the organic solvent vapor generated by evaporation of the organic solvent liquid supplied to the upper surface of the substrate. Therefore, there is no need to independently supply an organic solvent vapor used in the thin-film holding step to the upper surface of the substrate. This makes it possible to achieve a reduction in cost.

The liquid film forming step may include a high-temperature organic solvent supply step of supplying the organic solvent liquid having a liquid temperature higher than a room temperature to the upper surface.

According to this method, the liquid temperature of the organic solvent liquid supplied to the upper surface of the substrate is high, and therefore a thin film of the organic solvent that has been thinned also has a high liquid temperature. It is possible to spin off the organic solvent liquid on the upper surface of the substrate by the high-speed rotation of the substrate. At this time, the thin film of the organic solvent has a high liquid temperature, and therefore the evaporation speed of the organic solvent liquid that has entered a gap of the inside of the pattern is high. Therefore, it is possible to shorten a period of drying time. This makes it possible to further prevent the pattern from being collapsed.

The present invention provides a substrate processing apparatus that includes a substrate holding unit that horizontally holds a substrate, a substrate rotating unit that rotates the substrate held by the substrate holding unit, an organic solvent supply unit that supplies an organic solvent liquid to the upper surface of the substrate, an organic solvent vapor supply unit that supplies an organic solvent vapor to the upper surface of the substrate, and a control unit that controls the substrate holding unit, the substrate rotating unit, the organic solvent supply unit, and the organic solvent vapor supply unit, and the control unit performs a liquid film forming step of forming a liquid film of an organic solvent with which a whole area of the upper surface is covered in order to replace a processing liquid existing on the upper surface with an organic solvent liquid, a thin film holding step of thinning the liquid film of the organic solvent by rotating the substrate at a first high rotational speed while keeping surroundings of the whole area of the upper surface in an atmosphere of an organic solvent vapor and holding a resulting thin film of the organic solvent on the upper surface, and a thin-film removing step of removing the thin film from the upper surface after the thin film holding step, the thin-film removing step including a high-speed rotation step of rotating the substrate at a first high rotational speed.

According to this arrangement, a liquid film of an organic solvent with which a whole area of the upper surface is covered is formed, and thereafter the substrate is rotated at a high speed while keeping the surroundings of the whole area of the upper surface in an atmosphere of an organic solvent vapor. Most of the organic solvent liquid on the upper surface of the substrate is spun off by the high-speed rotation of the substrate. Therefore, most of the organic solvent liquid included in the liquid film of the organic solvent is discharged outwardly from the substrate, and the liquid film of the organic solvent is thinned. However, the surroundings of the entire upper surface of the substrate are kept in the atmosphere of the organic solvent vapor, and therefore the diffusion of the organic solvent vapor is not advanced, and, as a result, the evaporation of the organic solvent liquid is restrained or prevented from being advanced in the upper surface of the substrate. This makes it impossible to remove all of the organic solvent liquid forming the liquid film of the organic solvent, and the thin film of the organic solvent with which the whole area of the upper surface is covered is held on the upper surface of the substrate.

Additionally, the surroundings of the entire upper surface of the substrate are kept in the atmosphere of the organic solvent vapor, and therefore the diffusion of the organic solvent vapor is restrained from being advanced in the whole area of the upper surface of the substrate, and, as a result, it is possible to keep the thin film of the organic solvent uniform in thickness in the whole area of the upper surface of the substrate. Thereafter, the thin film of the organic solvent is removed from the upper surface of the substrate. In other words, the organic solvent liquid is removed from a gap of the inside of the pattern.

The liquid film of the organic solvent is temporarily thinned so as to be the thin film having a uniform, small thickness, and then the removal of the organic solvent liquid is started, and therefore it is possible to remove the organic solvent liquid from the upper surface of the substrate while maintaining a state in which the liquid surface height of the organic solvent that has entered the gap of the inside of the pattern does not vary in the substrate surface. This makes it possible to restrain or prevent the pattern from being collapsed.

In one preferred embodiment of the present invention, the substrate processing apparatus further includes a seal chamber that has an internal space sealed up from the outside, and the substrate holding unit is accommodated in the internal space.

According to this arrangement, it is possible to bring the whole area of the internal space of the seal chamber into the atmosphere of the organic solvent vapor by containing the substrate in the internal space of the seal chamber and by bringing the exhaust valve into a closed state. Therefore, it is possible to reliably keep the surroundings of the entire upper surface of the substrate in the atmosphere of the organic solvent vapor. Accordingly, in the organic solvent thin-film holding step, it is possible to reliably stop the evaporation of the organic solvent liquid in the upper surface of the substrate (i.e., the diffusion of the organic solvent vapor in the upper surface of the substrate), and hence is possible to reliably form the thin film of the organic solvent that has a uniform, thin thickness on the upper surface of the substrate.

Additionally, the substrate processing apparatus may further include an exhaust valve that exhausts the internal space of the seal chamber. In this case, the control unit may perform the thin film holding step in a state in which the exhaust valve is closed.

According to this arrangement, it is possible to keep the internal space in a closed state by closing the exhaust unit that exhausts the internal space of the seal chamber. This makes it possible to reliably form a thin film of an organic solvent that has a uniform, small thickness on the upper surface of the substrate in the thin film holding step. The aforementioned or other objects, features, and effects of the present invention will be clarified by the following description of preferred embodiments given below with reference to the accompanying drawings.

DETAILED DESCRIPTION OF PREFERRED EMBODIMENTS

Figure 1:
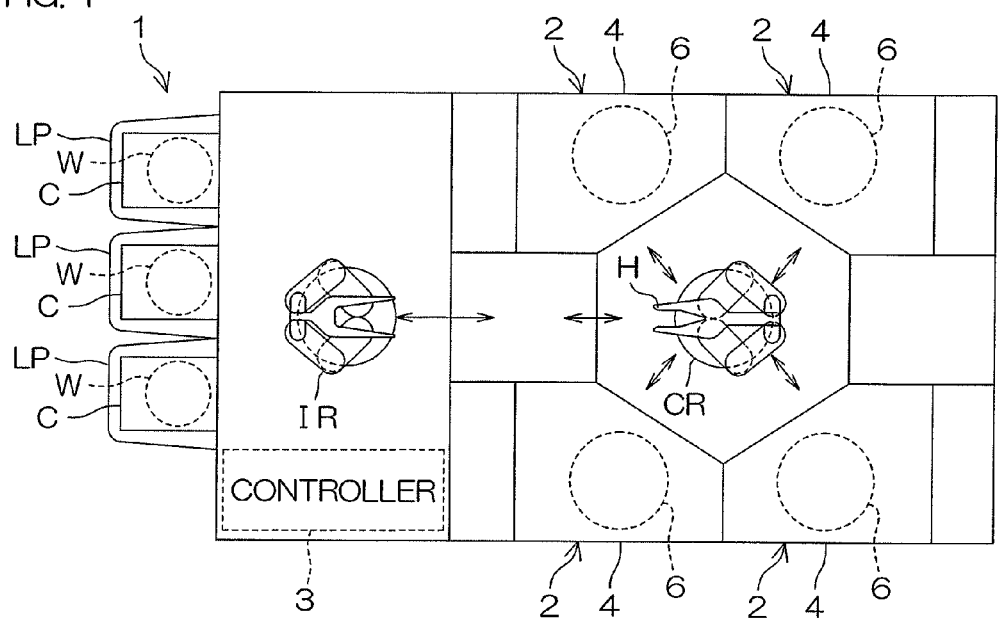
FIG. 1 is a plan view schematically to describe the layout of the inside of a substrate processing apparatus according to a first preferred embodiment of the present invention.

FIG. 1 is a plan view schematically to describe the layout of the inside of a substrate processing apparatus according to a first preferred embodiment of the present invention. The substrate processing apparatus 1 is a single substrate processing type apparatus that processes substrates W, such as silicon wafers, one by one. In this preferred embodiment, the substrate W is a disk-shaped substrate. The substrate processing apparatus 1 includes a plurality of processing units 2 each of which processes a substrate W by use of a processing liquid, a load port LP on which a carrier C that contains a plurality of substrates W to be processed by the processing unit 2 is placed, transfer robots IR and CR that convey substrates W between the load port LP and the processing unit 2, and a controller 3 that controls the substrate processing apparatus 1. The transfer robot IR conveys substrates W between the carrier C and the transfer robot CR. The transfer robot CR conveys substrates W between the transfer robot IR and the processing unit 2. The processing units 2 each have, for example, the same arrangement.

Figure 2:
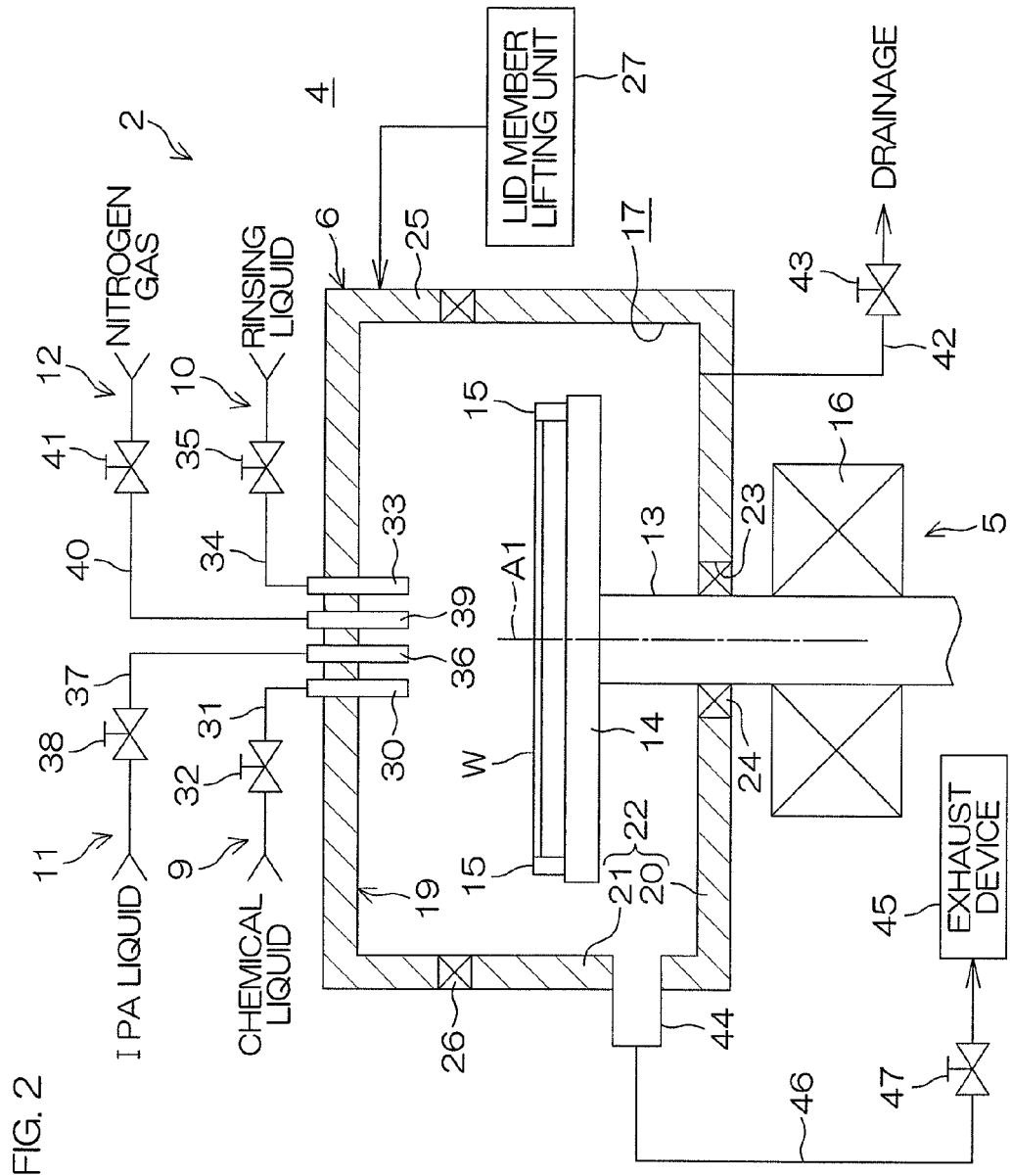
FIG. 2 is a cross-sectional view schematically to describe an arrangement example of a processing unit included in the substrate processing apparatus.

FIG. 2 is a cross-sectional view schematically to describe an arrangement example of the processing unit 2. The processing unit 2 is composed of a spin chuck (substrate holding unit) 5 that is disposed in a processing chamber 4 partitioned by a partition wall (not shown) and that rotates a substrate W around a vertical rotational axis A1 passing through a central portion of the substrate W while holding the single substrate W horizontally, a cup-shaped seal chamber 6 that is disposed in the processing chamber 4 and that is capable of defining a sealed space containing a part (in the present preferred embodiment, a spin base 14 and a gripping member 15) of the spin chuck 5 therein, an exhaust unit 8 that exhausts an internal space 7 of the seal chamber 6, a chemical liquid supply unit 9 that supplies a chemical liquid to the upper surface of a substrate W held by the spin chuck 5, a rinsing liquid supply unit 10 that supplies a rinsing liquid to the upper surface of the substrate W held by the spin chuck 5, a first organic solvent supply unit 11 that supplies an organic solvent liquid lower in surface tension than water to the upper surface of the substrate W held by the spin chuck 5, and an inert gas supply unit 12 that supplies a high-temperature inert gas to the internal space 7 of the seal chamber 6.

A carry-in/carry-out opening through which a substrate W is carried in or out is formed in the processing chamber 4, and a shutter unit that opens and closes the carry-in/carry-out opening is provided, which are not shown. The processing chamber 4 includes a FFU (fan filter unit, not shown) that serves as a blower unit that blows clean air into the processing chamber 4 and an exhaust unit (not shown) that discharges gases existing in the processing chamber 4. The exhaust unit always works during the operation of the substrate processing apparatus 1. Therefore, fresh outdoor air always continues to be supplied into the processing chamber 4.

For example, a clamping type chuck is employed as the spin chuck 5 in the present preferred embodiment. The spin chuck 5 is composed of a cylindrical rotational shaft 13 that extends vertically, a disk-shaped spin base 14 attached to the upper end of the rotational shaft 13 in a horizontal posture, a plurality of (at least three, for example six) clamping members 15 that are evenly spaced out on the spin base 14, and an electric motor (substrate rotating unit) 16 that is connected to the rotational shaft 13 and that serves as a substrate rotating unit. The clamping members 15 clamp a substrate W in a substantially horizontal posture. When the electric motor 16 is driven in this state, the spin base 14 is rotated around a predetermined rotational axis (vertical axis) A1 by means of its driving force, and is rotated around the rotational axis A1 together with the spin base 14 in a state in which the substrate W maintains a substantially horizontal posture.

Without being limited to the clamping type chuck to be employed as the spin chuck 5, for example, a vacuum suction type chuck may be employed in which a substrate W is held in a horizontal posture by sucking the rear surface (undersurface) of the substrate W by a vacuum and, in this state, is rotated by allowing the substrate W to rotate around the rotational axis A1.

The seal chamber 6 is composed of a chamber body 18 that has an opening 17 in its upper surface and that is formed in a substantially cylindrical shape and a lid member 19 to open or close the opening 17. The internal space 7 of the seal chamber 6 is sealed up from the outside in a state in which the lid member 19 closes the opening 17 of the chamber body 18.

The chamber body 18 has a partition wall 22 integrally including a substantially disk-shaped bottom wall portion 20 and a peripheral wall portion 21 that rises upwardly from the peripheral edge of the bottom wall portion 20. The peripheral wall portion 21 surrounds the periphery of the spin chuck 5. The bottom wall portion 20 closes a region surrounded by the peripheral wall portion 21 from below. A through-hole 23 through which the rotational shaft 13 of the spin chuck 5 is inserted is formed at the middle of the bottom wall portion 20. A first annular sealing member 24 is fixedly disposed at a position corresponding to the through-hole 23 in the outer peripheral surface of the rotational shaft 13.

The first sealing member 24 seals the outer peripheral surface of the rotational shaft 13 and the through-hole 23 of the bottom wall portion 20 so that the rotational shaft 13 becomes rotatable around the rotational axis A1 without coming into contact with the bottom wall portion 20. A magnetic fluid seal can be mentioned as an example of the first sealing member 24. In other words, the chamber body 18 (seal chamber 6) is constructed so as not to rotate together with the rotational shaft 13. Additionally, it is possible for the first sealing member 24 to intercept (seal up) the internal space 7 of the seal chamber 6 from a space outside the seal chamber 6 in the processing chamber 4.

A capturing cup (not shown) to capture a processing liquid scattering from the substrate W held by the spin chuck 5 is disposed at the inner periphery of the peripheral wall portion 21, and this capturing cup may be connected to drainage facilities disposed outside the apparatus.

The lid member 19 has a substantially disk shape having a diameter slightly larger than the substrate W, and is disposed in a substantially horizontal posture above the spin chuck 5. The lid member 19 is disposed such that its center is positioned on the rotational axis A1 of the substrate W. A cylindrical flange portion 25 that droops downwardly from the peripheral edge of the lid member 19 is formed at the peripheral edge thereof. The undersurface of the flange portion 25 faces the upper surface of the peripheral wall portion 21 of the chamber body 18. The lid member 19 is arranged so as to close the opening 17 of the chamber body 18 from the upper side of the spin chuck 5. A second sealing member 26 is fixedly disposed on the lower end surface of the flange portion 25 of the lid member 19. The second sealing member 26 is, for example, a seal ring. The second sealing member 26 is made of, for example, a resinous elastic material.

A lid member lifting unit 27 that moves the lid member 19 upwardly and downwardly with respect to the chamber body 18 is attached to the lid member 19. The driving of the lid member lifting unit 27 makes it possible to move the lid member 19 upwardly and downwardly between a closing position (position shown in FIG. 2) at which the lid member 19 closes the opening 17 of the chamber body 18 and an opening position (position shown in FIG. 5A) at which the lid member 19 is away from the chamber body 18 with a predetermined distance between the lid member 19 and the chamber body 18. In a state in which the lid member 19 is in the closing position (closed state), the second sealing member 26 disposed on the lower end surface of the flange portion 25 of the lid member 19 comes into contact with the upper end surface of the peripheral wall portion 21 of the chamber body 18 in the whole area in the circumferential direction, thus making it possible to seal the part between the chamber body 18 and the lid member 19 on the upper and lower sides. In this closed state, the internal space 7 of the seal chamber 6 is intercepted from a space outside the seal chamber 6 in the processing chamber 4. In other words, the internal space 7 reaches a state sealed up from the outside.

The exhaust unit 8 includes an exhaust duct 44 connected to the peripheral wall portion 21 of the chamber body 18 of the seal chamber 6, an exhaust device 45, such as a suction device, that sucks the atmosphere of the internal space 7 of the seal chamber 6 through the exhaust duct 44, an exhaust pipe 46 that connects the exhaust duct 44 and the exhaust device 45 together, and an exhaust valve 47 that opens and closes the exhaust pipe 46. In a state in which the exhaust valve 47 has been opened, the internal space 7 of the seal chamber 6 reaches an open state of being opened with respect to the outside. In a state in which the exhaust valve 47 has been closed, the internal space 7 of the seal chamber 6 reaches a closed state of being sealed up from the outside.

A drainage pipe 42 is connected to the bottom wall portion 20 of the chamber body 18 of the seal chamber 6. The drainage pipe 42 is connected to drainage facilities (waste liquid processing facilities (not shown) or recovery treatment facilities (not shown)). Accordingly, a processing liquid used for substrate processing is recovered or discarded. The drainage pipe 42 is opened or closed by a drainage valve 43.

In the seal chamber 6, the first sealing member 24 and the second sealing member 26 are provided, thus making it possible to maintain the sealed state of the inside of the internal space 7. However, if the supply flow rate of a gas from the inert gas supply unit 12 is enough, it is possible to change the internal space 7 of the seal chamber 6 to a pressurized state even if the seal chamber 6 is not provided with the first sealing member 24 and the second sealing member 26 and even if the seal chamber 6 is not sealed up. Therefore, the provision of the first and second sealing members 24 and 26 in the seal chamber 6 is not an indispensable arrangement, and it is also possible to exclude the first sealing member 24 and the second sealing member 26.

The chemical liquid supply unit 9 includes a chemical liquid nozzle 30. The chemical liquid nozzle 30 is fixedly attached to a center portion of the lid member 19 of the seal chamber 6, and extends so as to pass through this center portion in the vertical direction. A chemical liquid pipe 31 to which a chemical liquid is supplied from a chemical liquid supply source is connected to the chemical liquid nozzle 30. The chemical liquid nozzle 30 is fixedly disposed such that its discharge port is directed toward the neighborhood of the rotational center of the upper surface of the substrate W. A chemical liquid valve 32 by which the chemical liquid pipe 31 is opened and closed is interposed in the chemical liquid pipe 31. When the chemical liquid valve 32 is opened, a continuously-flowing chemical liquid that has been supplied from the chemical liquid pipe 31 to the chemical liquid nozzle 30 is discharged from the discharge port formed at the lower end of the chemical liquid nozzle 30. When the chemical liquid valve 32 is closed, the supply of the chemical liquid from the chemical liquid pipe 31 to the chemical liquid nozzle 30 is stopped.

Concrete examples of the chemical liquid are an etching liquid and a cleaning liquid. More specifically, the chemical liquid may be hydrofluoric acid, SC1 (ammonia hydrogen peroxide water mixture), SC2 (hydrochloric acid hydrogen peroxide water mixture), or buffered hydrofluoric acid (mixture of hydrofluoric acid and ammonium fluoride).

The rinsing liquid supply unit 10 includes a rinsing liquid nozzle 33. The rinsing liquid nozzle 33 is fixedly attached to the center portion of the lid member 19 of the seal chamber 6, and extends so as to pass through this center portion in the vertical direction. A rinsing liquid pipe 34 to which a rinsing liquid is supplied from a rinsing liquid supply source is connected to the rinsing liquid nozzle 33. The rinsing liquid nozzle 33 is fixedly disposed such that its discharge port is directed toward the neighborhood of the rotational center of the upper surface of the substrate W. A rinsing liquid valve 35 by which the rinsing liquid pipe 34 is opened and closed is interposed in the rinsing liquid pipe 34. When the rinsing liquid valve 35 is opened, a continuously-flowing rinsing liquid that has been supplied from the rinsing liquid pipe 34 to the rinsing liquid nozzle 33 is discharged from the discharge port formed at the lower end of the rinsing liquid nozzle 33. When the rinsing liquid valve 35 is closed, the supply of a rinsing liquid from the rinsing liquid pipe 34 to the rinsing liquid nozzle 33 is stopped. The rinsing liquid is, for example, deionized water (DIW), and yet, without being limited to DIW, the rinsing liquid may be any one of soda water, electrolyzed ion water, hydrogenated water, ozonized water, and hydrochloric acid water having a diluted concentration (for example, about 10 ppm to 100 ppm).

The first organic solvent supply unit 11 includes a first organic solvent nozzle 36. The first organic solvent nozzle 36 is fixedly attached to the center portion of the lid member 19 of the seal chamber 6, and extends so as to pass through this center portion in the vertical direction. A first organic solvent pipe 37 to which an organic solvent liquid, such as isopropyl alcohol (IPA), is supplied from an organic solvent supply source is connected to the first organic solvent nozzle

36. The first organic solvent nozzle 36 is fixedly disposed such that its discharge port is directed toward the neighborhood of the rotational center of the upper surface of the substrate W. A first organic solvent valve 38 by which the first organic solvent pipe 37 is opened and closed is interposed in the first organic solvent pipe 37. When the first organic solvent valve 38 is opened, a continuously-flowing organic solvent liquid that has been supplied from the first organic solvent pipe 37 to the first organic solvent nozzle 36 is discharged from the discharge port formed at the lower end of the first organic solvent nozzle 36. When the first organic solvent valve 38 is closed, the supply of an organic solvent liquid from the first organic solvent pipe 37 to the first organic solvent nozzle 36 is stopped.

The inert gas supply unit 12 includes an inert gas nozzle 39. The inert gas nozzle 39 is fixedly attached to the center portion of the lid member 19 of the seal chamber 6, and extends so as to pass through this center portion in the vertical direction. A first inert gas pipe 40 to which a high-temperature inert gas (higher than a room temperature: e.g., 20 to 300° C.), such as high-temperature nitrogen gas or clean air, is supplied from a high-temperature inert gas supply source is connected to the inert gas nozzle 39. The inert gas nozzle 39 is fixedly disposed such that its discharge port is directed toward the neighborhood of the rotational center of the upper surface of the substrate W. A first inert gas valve 41 by which the first inert gas pipe 40 is opened and closed is interposed in the first inert gas pipe 40. When the first inert gas valve 41 is opened, a high-temperature inert gas that has been supplied from the first inert gas pipe 40 to the inert gas nozzle 39 is discharged from the discharge port formed at the lower end of the inert gas nozzle 39. When the first inert gas valve 41 is closed, the supply of a high-temperature inert gas from the first inert gas pipe 40 to the inert gas nozzle 39 is stopped.

Figure 3:
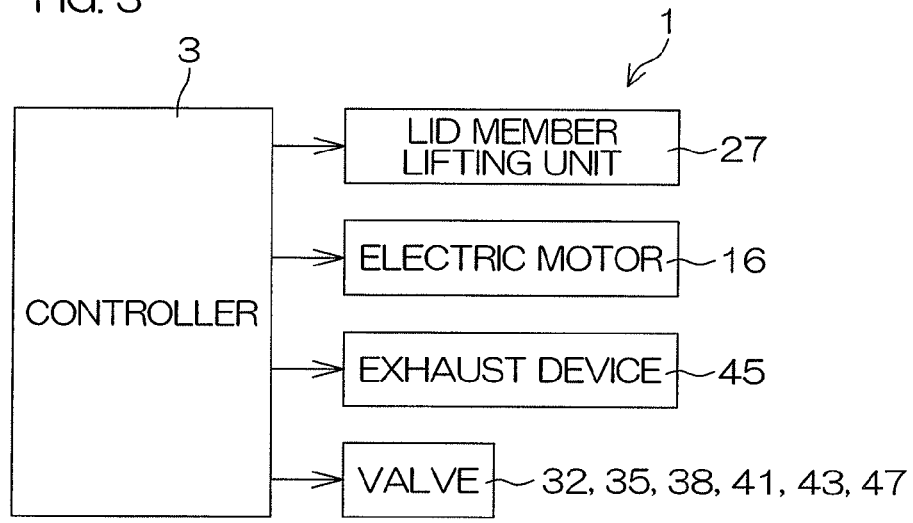
FIG. 3 is a block diagram to describe an electric arrangement of a main part of the substrate processing apparatus.

FIG. 3 is a block diagram to describe an electric arrangement of a main part of the substrate processing apparatus 1.

The controller 3 controls the operations of the lid member lifting unit 27, the electric motor 16, the exhaust device 45, etc., in accordance with a predetermined program. Additionally, the controller 3 controls the open-close operations of the chemical liquid valve 32, the rinsing liquid valve 35, the first organic solvent valve 38, the first inert gas valve 41, the drainage valve 43, the exhaust valve 47, etc.

Figure 4:
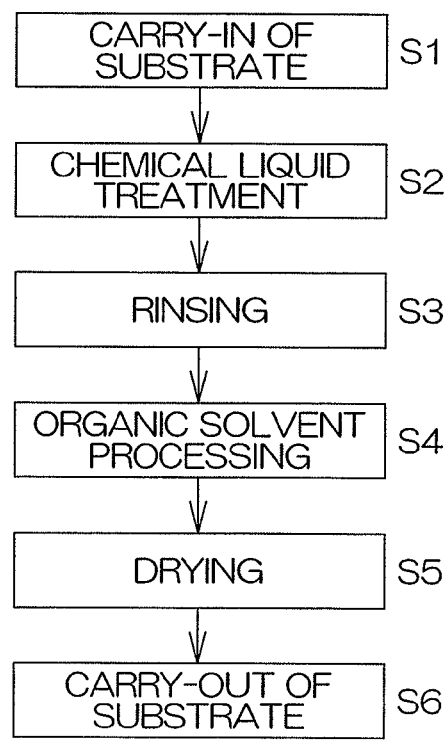
FIG. 4 is a flowchart to describe one example of substrate processing performed by the substrate processing apparatus.

FIG. 4 is a flowchart to describe one example of substrate processing performed by the substrate processing apparatus 1. FIG. 5A to FIG. 5G are cross-sectional views schematically to describe a situation of each step of the substrate processing.

Figure 5A:
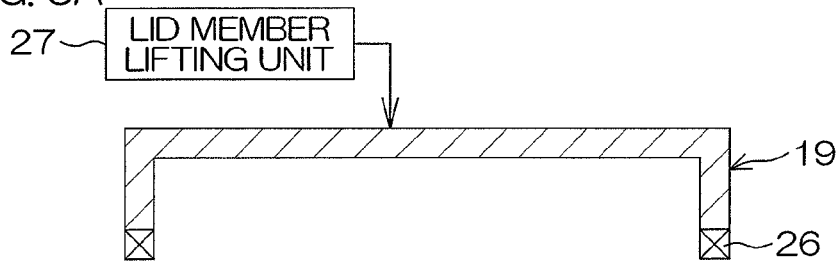
FIG. 5A to FIG. 5G are cross-sectional views schematically to describe the situation of each step of the substrate processing.

An unprocessed substrate W is transport into the processing unit 2 from the carrier C by means of the transfer robots IR and CR, and is furthermore carried into the seal chamber 6, and is passed to the spin chuck 5, and is held thereby as shown in FIG. 5A (S1: substrate holding step). As shown in FIG. 5A, prior to the carry-in of the substrate W, the lid member 19 of the seal chamber 6 is disposed at an opening position that is away from the chamber body 18 with a predetermined distance therebetween. After the carry-in of the substrate W, the lid member 19 is lowered, and is disposed at a closing position that comes into contact with an upper portion of the chamber body 18.

Figure 5B:
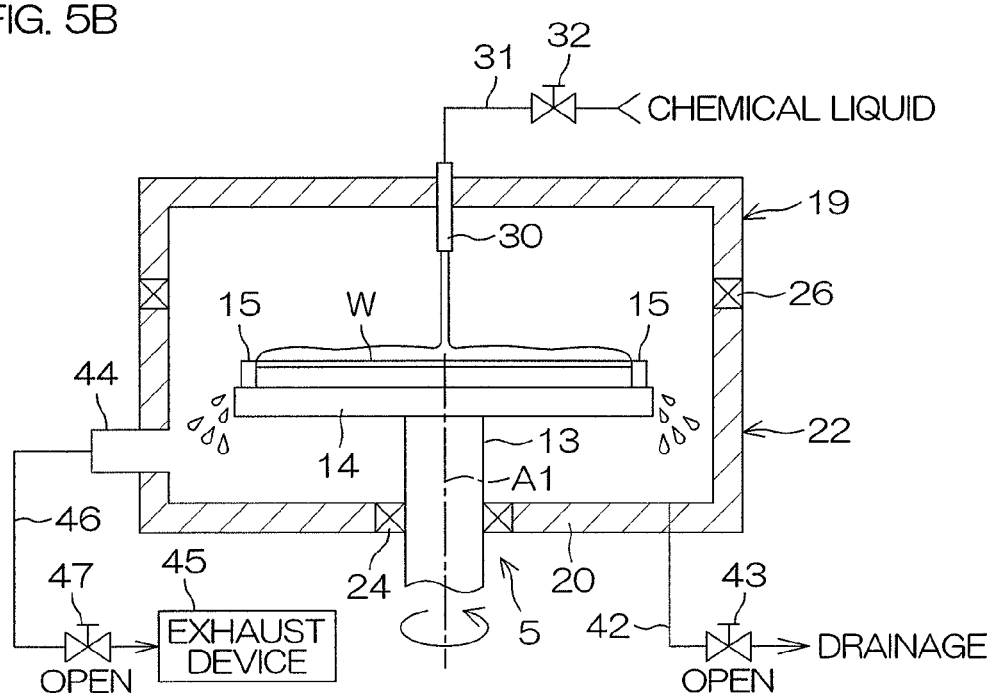

The transfer robot CR recedes outwardly from the processing unit 2, and then chemical liquid treatment (S2) is started. When the chemical liquid treatment is started, both the drainage valve 43 and the exhaust valve 47 are in an open state. The controller 3 drives the electric motor 16 and rotates the spin base 14 at a predetermined liquid-treatment rotation speed. Thereafter, the controller 3 opens the chemical liquid valve 32. As a result, a chemical liquid is supplied from the chemical liquid nozzle 30 toward the upper surface of the substrate W being in a rotational state as shown in FIG. 5B. The chemical liquid supplied thereto spreads over the entire surface of the substrate W by means of a centrifugal force. The chemical liquid supplied to the substrate W is sent outwardly from the apparatus through the drainage pipe 42.

Figure 5C:
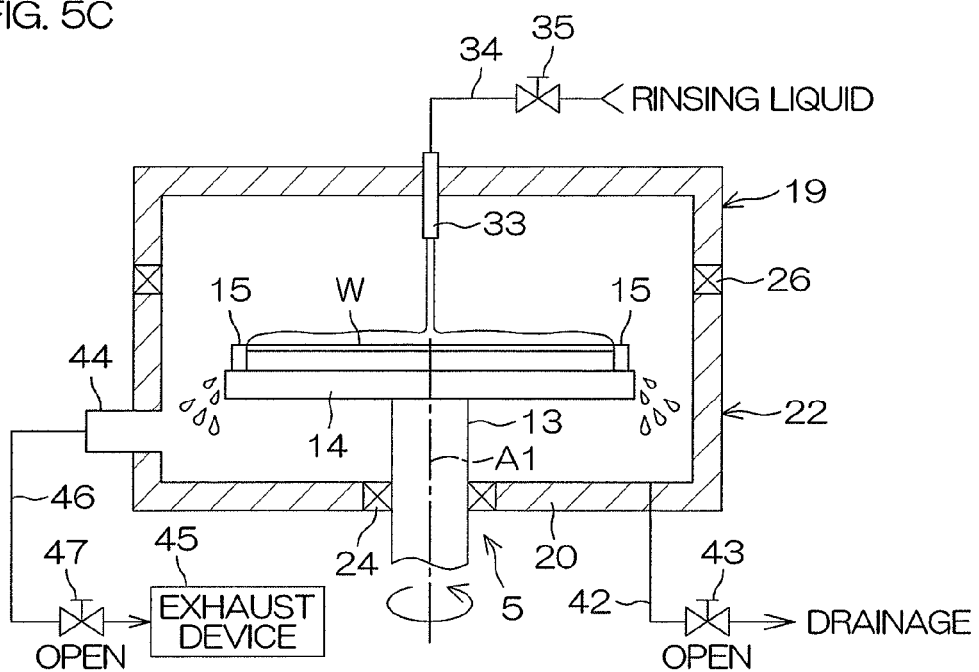

After performing the chemical liquid treatment for a fixed time, the chemical liquid on the substrate W is replaced with a rinsing liquid, and, accordingly, rinsing (S3) to exclude the chemical liquid existing on the substrate W is performed. Specifically, the controller 3 closes the chemical liquid valve 32, and, instead, opens the rinsing liquid valve 35. As a result, a rinsing liquid is supplied from the rinsing liquid nozzle 33 toward the upper surface of the substrate W being in a rotational state as shown in FIG. 5C. The rinsing liquid supplied thereto spreads over the entire surface of the substrate W by means of a centrifugal force. The chemical liquid on the substrate W is rinsed away by the rinsing liquid. The rinsing liquid supplied to the substrate W is sent outwardly from the apparatus through the drainage pipe 42.

After performing the rinsing for a fixed time, organic solvent processing (S4) is performed in which the rinsing liquid on the substrate W is replaced with an organic solvent liquid that is a low surface-tension liquid having lower surface tension.

Figure 5D:
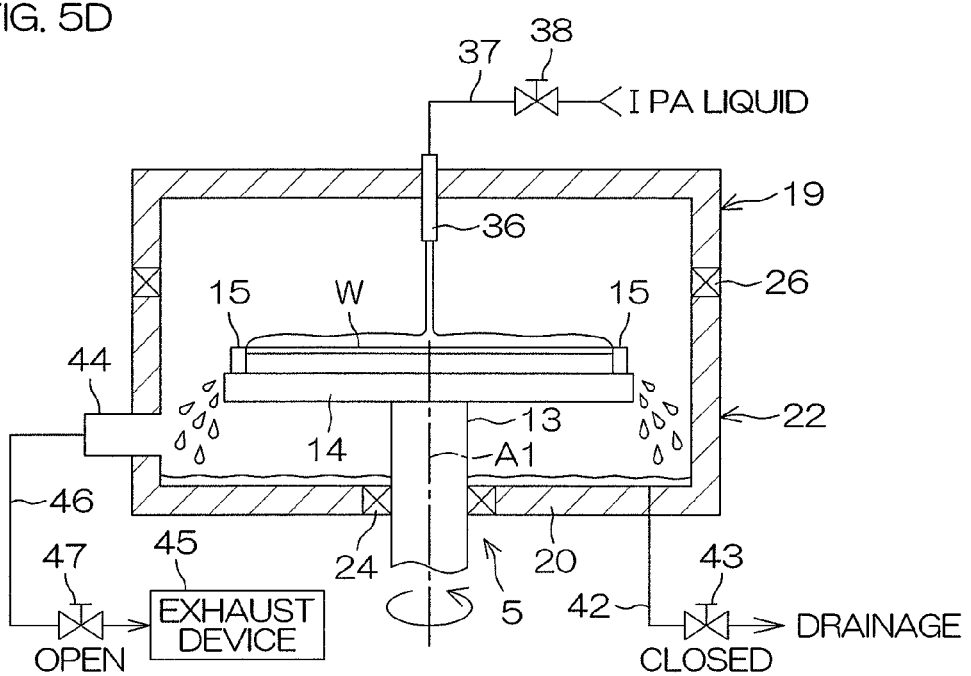
Figure 5E:
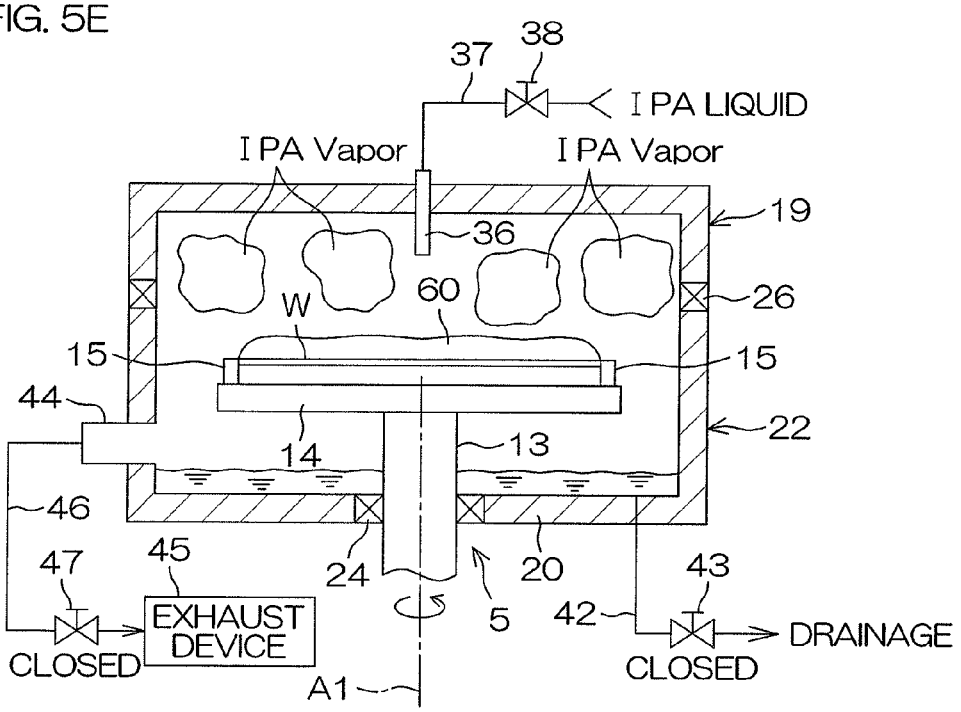
Figure 5F:
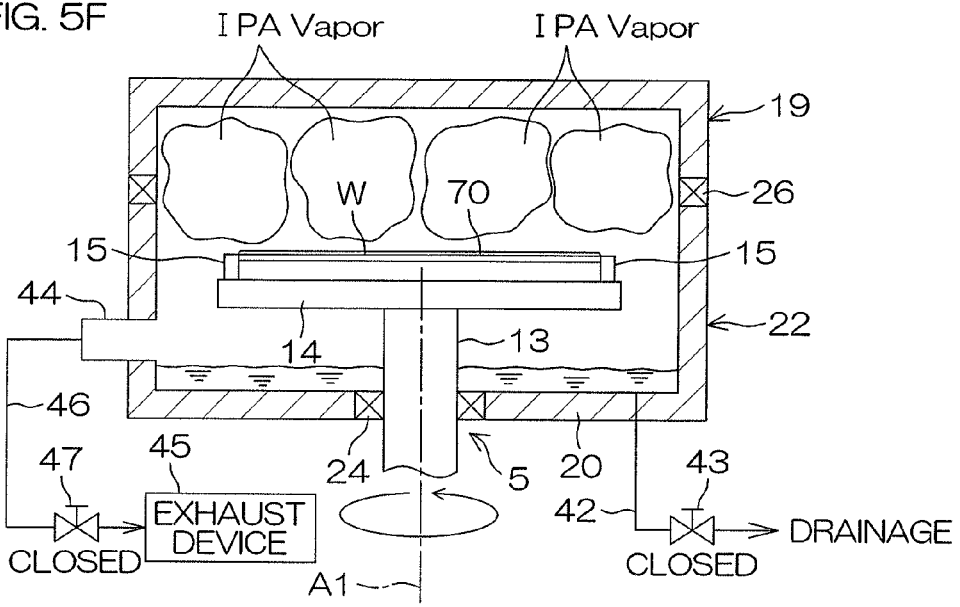
Figure 5G:
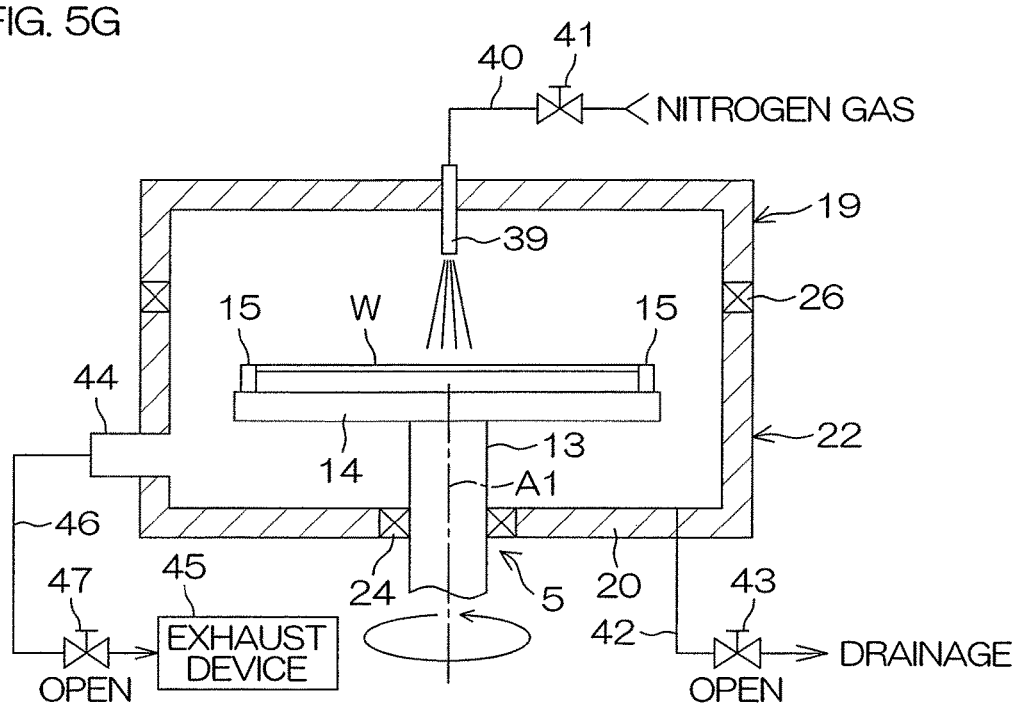
Figure 6:
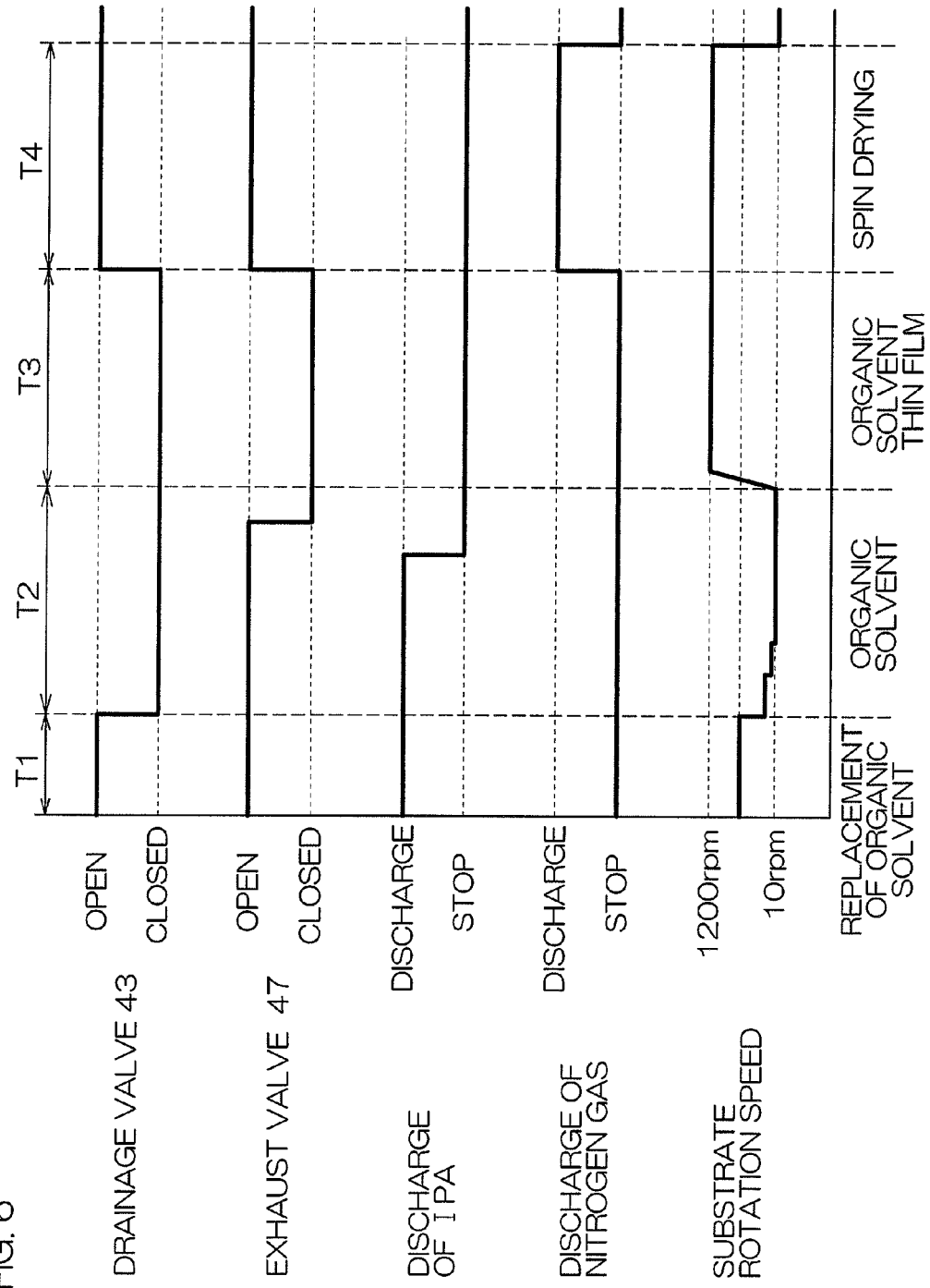
FIG. 6 is a time chart to describe the details of organic solvent processing (S4 of FIG. 4).

FIG. 6 is a time chart to describe the details of the organic solvent processing (S4 of FIG. 4). The organic solvent processing will be described with reference to FIGS. 5A to 5G and FIG. 6.

The organic solvent processing includes an organic solvent replacing step (liquid film forming step) T1 (see FIG. 5D), an organic solvent puddling step (liquid film forming step) T2 (see FIG. 5E), and an organic solvent thin-film holding step (thin film holding step) T3 (see FIG. 5F), and these steps are performed in this order.

The organic solvent replacing step T1 is a step in which an organic solvent liquid is supplied to the upper surface of the substrate W while rotating the substrate W. As shown in FIG. 5D, a liquid of the organic solvent (e.g., IPA) is supplied to the upper surface of the substrate W from the first organic solvent nozzle 36. Furthermore, the controller 3 closes the drainage valve 43 in synchronization with the start of supplying an organic solvent liquid.

The organic solvent supplied to the upper surface of the substrate W receives a centrifugal force and proceeds outwardly from the center of the upper surface of the substrate W, and forms a liquid film of the organic solvent with which the upper surface of the substrate W is covered. A rinsing liquid supplied to the upper surface of the substrate W in rinsing (S3 of FIG. 4) is all replaced with an organic solvent liquid by covering the whole area of the upper surface of the substrate W with the liquid film.

An organic solvent liquid that has overflowed from the upper surface of the substrate W is supplied to the bottom wall portion 20 of the seal chamber 6. The drainage valve 43 is in a closed state, and therefore the organic solvent liquid supplied to the bottom wall portion 20 is gathered on the bottom wall portion 20. IPA used as an example of the organic solvent has high volatility (i.e., has a boiling point lower than water), and therefore the organic solvent gathered on the bottom wall portion 20 of the seal chamber 6 evaporates, and an organic solvent vapor (IPA vapor) intermittently occurs in the internal space 7.

During the organic solvent replacing step T1, the substrate W is rotated by the spin chuck 5 at an organic solvent replacement speed (e.g., about 300 rpm). The first organic solvent valve 38 is brought into an open state, and therefore an organic solvent liquid discharged from the first organic solvent nozzle 36 is supplied from above toward the rotational center of the upper surface of the substrate W.

As shown in FIG. 5E, the organic solvent puddling step T2 is a step in which the rotation of the substrate W is decreased to be kept at a puddle speed (e.g., 10 rpm), and a thick liquid film 60 of the organic solvent is formed and held on the upper surface of the substrate W. The whole area of the upper surface of the substrate W is covered with the liquid film 60.

In this example, the rotation of the substrate W is decreased stepwisely from the organic solvent replacement speed. More specifically, the rotation speed of the substrate W is decreased stepwisely from 300 rpm to reach the puddle speed, and is maintained for a predetermined time (e.g., seven seconds). After the thick liquid film 60 of the organic solvent is formed, the discharge of the organic solvent liquid from the first organic solvent nozzle 36 is stopped.

After the discharge of the organic solvent liquid is stopped, the controller 3 closes the exhaust valve 47. As a result, the internal space 7 of the seal chamber 6 is closed from the outside. Therefore, it is impossible for the organic solvent vapor that has occurred in the internal space 7 to flee outwardly from the seal chamber 6. As a result, the internal space 7 is filled with the organic solvent vapor. In other words, the surroundings of the entire upper surface of the substrate W are kept in a state in which the organic solvent vapor is rich. Therefore, the surroundings of the entire upper surface of the substrate W are kept in a state in which an organic solvent vapor is rich while using an organic solvent vapor generated by the evaporation of the organic solvent liquid supplied to the upper surface of the substrate W. In other words, in the present preferred embodiment, the first organic solvent supply unit 11 functions not only as an organic solvent supply unit but also as an organic solvent vapor supply unit.

The "state in which an organic solvent vapor is rich" may be a state in which only an organic solvent vapor exists or may be a state in which an organic solvent vapor exists together with other gases. Additionally, in this state, the surroundings of the entire upper surface of the substrate W may be in a saturated condition.

The organic solvent thin-film holding step T3 is a step in which a thick liquid film 60 of an organic solvent is formed on the upper surface of the substrate W, and then the substrate W is rotated at a high rotational speed (a first high rotational speed of about 1200 rpm) while keeping the surroundings of the entire upper surface of the substrate W in a state in which an organic solvent vapor is rich as shown in FIG. 5F. Most of the organic solvent liquid on the upper surface of the substrate W is spun off by the high-speed rotation of the substrate W. Therefore, most of the organic solvent liquid included in the thick liquid film 60 of the organic solvent is discharged outwardly from the substrate W, and the liquid film 60 of the organic solvent is thinned. However, the surroundings of the entire upper surface of the substrate W are kept in an atmosphere of an organic solvent vapor (IPA vapor), and therefore the diffusion of the organic solvent vapor is not advanced in the upper surface of the substrate W, and, as a result, the evaporation of the organic solvent liquid is restrained or prevented from being advanced in the upper surface of the substrate W. Therefore, it is impossible to remove all of the organic solvent liquid forming the thick liquid film 60 of the organic solvent. Accordingly, as shown in FIG. 5F, a thin film 270 (e.g., about 1 μm) of the organic solvent with which the whole area of the upper surface of the substrate W is covered is formed on the upper surface of the substrate W.

Following the organic solvent thin-film holding step T3, a spin drying step T4 (thin-film removing step, drying, S5 of FIG. 4) is performed as shown in FIG. 5G. Specifically, the controller 3 opens the drainage valve 43 and the first inert gas valve 41 while keeping the rotation of the substrate W at a high rotational speed (about 1200 rpm). The organic solvent liquid gathered at the bottom wall portion 20 of the seal chamber 6 is extracted from the seal chamber 6 by opening the drainage valve 43, and the organic solvent liquid extracted therefrom is sent to drainage facilities through the exhaust pipe 46. A high-temperature inert gas is sprayed onto the middle of the upper surface of the substrate W by opening the first inert gas valve 41.

In the spin drying step T4, the substrate W is rotated at a high speed while keeping the internal space 7 of the seal chamber 6 in an open state. The substrate W is rotated at a high rotational speed (second high rotational speed: about 1200 rpm) while keeping the internal space 7 in an open state. A fresh gas comes into contact with the upper surface of the substrate W when the internal space 7 is in an open state, and therefore the diffusion of an organic solvent vapor is advanced at different parts of the upper surface of the substrate W, and the evaporation of an organic solvent liquid is advanced at different parts of the upper surface of the substrate W. As a result of the high-speed rotation of the substrate W, the organic solvent liquid adhering to the upper surface of the substrate W is completely spun off toward the surroundings of the substrate W, and the evaporation of the organic solvent liquid is advanced in the upper surface of the substrate W. Accordingly, the thin film 270 of the organic solvent is completely removed from the upper surface of the substrate W.

Additionally, in the spin drying step T4, the substrate W is rotated at a high speed while supplying a high-temperature inert gas to the upper surface of the substrate W. In response to the supply of the high-temperature inert gas to the upper surface of the substrate W, the advancement of the evaporation of the organic solvent liquid that has entered the inside of the pattern P is accelerated.

After finishing the spin drying step T4, the rotation of the spin chuck 5 is stopped, and the first inert gas valve 41 is closed, and the discharge of the inert gas from the inert gas nozzle 39 is stopped. Thereafter, the controller 3 allows a processed substrate W to be carried out from the processing unit 2 by means of the transfer robot CR.

Figure 7A:
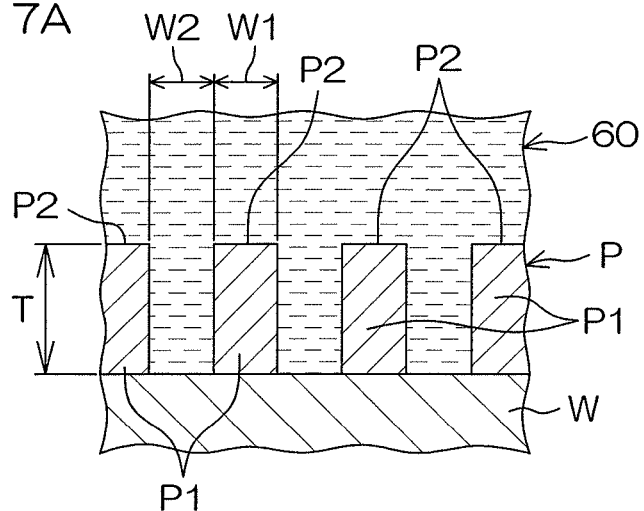
FIG. 7A to FIG. 7C are cross-sectional views schematically to describe the situation of an upper surface of a substrate in each step of the substrate processing mentioned above.
Figure 7B:
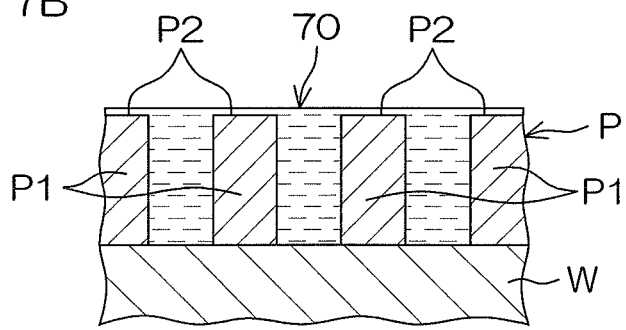
Figure 7C:
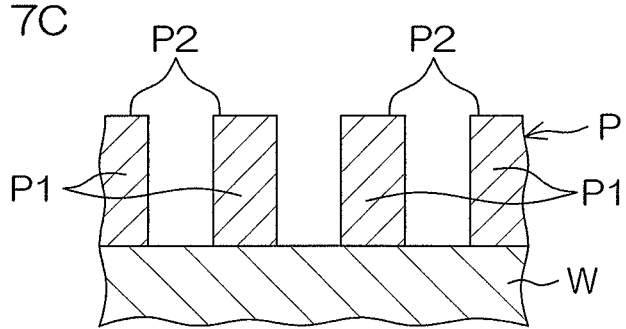

FIG. 7A to FIG. 7C are cross-sectional views schematically to describe a situation of the upper surface of the substrate W in organic solvent processing (S4 of FIG. 4) and drying (S5 of FIG. 4). A fine pattern P is formed on the front surface of the substrate W. The pattern P includes fine, convex structural elements P1 formed on the front surface of the substrate W. The structural element P1 may include an insulator film or may include a conductor film. Additionally, the structural element P1 may be a laminated film in which a plurality of films are stacked up together. If linear structural elements P1 are arranged to be adjacent to each other, a groove is formed therebetween. If so, the width W1 of the structural element P1 may be about 10 nm to 45 nm, and the interval W2 between the structural elements P1 may be about 10 nm to several μm. The height T of the structural element P1 may be, for example, about 50 nm to 5 μm.

About 700 nm can be mentioned as an example. If the structural element P1 is cylindrical, a hole will be formed in its inner part.

In the organic solvent puddling step T2, as shown in FIG. 7A, the liquid surface height of the liquid film 60 of the organic solvent formed on the front surface of the substrate W is greatly higher than the height of each structural element P1 of the pattern P. Therefore, the liquid film 60 fills the inside (space between adjoining structural elements P1 or internal space of a cylindrical structural element P1) of the pattern P.

In order to restrain a pattern fall, an upper surface P2 of each structural element P1 is required to be immersed in the thin film 70 of the organic solvent. Therefore, in the organic solvent thin-film holding step T3, the liquid surface of the thin film 70 of the organic solvent is required to be disposed higher than the height of each structural element P1 of the pattern P as shown in FIG. 7B. However, preferably, the liquid surface height H1 of the thin film 70 of the organic solvent at this time is set to be as low as possible. In other words, preferably, the liquid surface height H1 of the thin film 70 of the organic solvent is set to be equal to the height of each structural element P1 or is set to be slightly higher (e.g., several μm) than the height of each structural element P1.

Conversely speaking, the liquid surface height H1 of the thin film 70 of the organic solvent is set to be slightly higher than the height of each structural element P1.

The present inventors consider that the thin film 70 of the organic solvent obtained by rotating the substrate W at a high speed is no longer influenced by a centrifugal force. Additionally, the present inventors consider that an influence caused by the evaporation of the thin film 70 of the organic solvent (diffusion of the organic solvent vapor) is the greatest.

Additionally, the present inventors consider that the thickness of the thin film 70 depends on the concentration of the organic solvent vapor in the upper surface of the substrate W and consider that the thickness of the thin film becomes larger in proportion to an increase in the concentration of the organic solvent vapor. In that sense, presumably, the thickness of the thin film 70 becomes the maximum when the organic solvent vapor reaches a saturated state in the upper surface of the substrate W. In this case, it is necessary to give some consideration to the influence of dewdrops of the organic solvent vapor.

In the spin drying step T4 (drying (S5 of FIG. 4)), the organic solvent liquid is removed from gaps of the pattern P as shown in FIG. 7C. The advancement of the evaporation of the organic solvent liquid that has entered the inside of the pattern P is accelerated in response to the supply of the high-temperature inert gas to the upper surface of the substrate W. This makes it possible to remove the organic solvent that has entered the inside of the pattern P in a short time.

As described above, according to the first preferred embodiment, the liquid film 60 of the organic solvent with which the whole area of the upper surface of the substrate W is covered is formed on the upper surface of the substrate W, and then the substrate W is rotated at a high speed while keeping the surroundings of the entire upper surface of the substrate W in a state in which the organic solvent vapor is rich. Most of the organic solvent liquid on the upper surface of the substrate W is spun off by the high-speed rotation of the substrate W. Therefore, most of the organic solvent liquid included in the liquid film of the organic solvent is discharged outwardly from the substrate W, and the liquid film 60 of the organic solvent is thinned. However, the surroundings of the entire upper surface of the substrate W are kept in a state in which the organic solvent vapor is rich, and therefore the diffusion of the organic solvent vapor is not advanced in the upper surface of the substrate W, and, as a result, the evaporation of the organic solvent liquid is restrained or prevented from being advanced in the upper surface of the substrate W. This makes it impossible to remove all of the organic solvent liquid forming the liquid film 60 of the organic solvent, and the thin film 70 of the organic solvent with which the whole area of the upper surface of the substrate W is covered is held on the upper surface of the substrate W.

Additionally, the surroundings of the entire upper surface of the substrate W are kept in a state in which the organic solvent vapor is rich, and therefore the diffusion of the organic solvent vapor is restrained from being advanced in the whole area of the upper surface of the substrate W, and, as a result, it is possible to keep the thin film 70 of the organic solvent uniform in thickness in the whole area of the upper surface of the substrate W. Thereafter, the thin film 70 of the organic solvent is removed from the upper surface of the substrate W. In other words, the organic solvent liquid is removed from between patterns P.

The liquid film 60 of the organic solvent is temporarily thinned so as to be the thin film 70 having a uniform, small thickness, and then the removal of the organic solvent liquid is started, and therefore it is possible to remove the organic solvent liquid from the upper surface of the substrate W while maintaining a state in which the liquid surface height of the organic solvent between patterns P does not vary at different parts of the upper surface of the substrate W. Therefore, it is possible to maintain the balance of surface tension (capillary force) generated in each pattern P when the organic solvent liquid is removed. This makes it possible to restrain or prevent the pattern P from being collapsed.

Additionally, when the organic solvent liquid is supplied to the internal space 7 and when the exhaust valve 47 is brought into a closed state (i.e., the internal space 7 is brought into a closed state), it is possible to bring the substantially whole area of the internal space 7 containing the substrate W into a state in which the organic solvent vapor is rich. Therefore, it is possible to reliably keep the surroundings of the entire upper surface of the substrate W in a state in which the organic solvent vapor is rich. Accordingly, in the organic solvent thin-film holding step T3, it is possible to reliably stop the evaporation of the organic solvent liquid in the upper surface of the substrate W (i.e., the diffusion of the organic solvent vapor in the upper surface of the substrate W), and hence is possible to reliably form the thin film 70 of the organic solvent that has a uniform, small thickness on the upper surface of the substrate W.

Additionally, the surroundings of the entire upper surface of the substrate W are kept in a state in which the organic solvent vapor is rich by use of the organic solvent vapor generated by the evaporation of the organic solvent liquid supplied to the upper surface of the substrate W. Therefore, there is no need to independently supply an organic solvent vapor used in the organic solvent thin-film holding step T3 to the upper surface of the substrate W. This makes it possible to achieve a reduction in cost.

In the spin drying step T4, a high-temperature inert gas is supplied to the upper surface of the substrate W, and the internal space 7 of the seal chamber 6 is brought into an open state. In the open state of the internal space 7, a fresh gas comes into contact with the upper surface of the substrate W, and therefore the diffusion of the organic solvent vapor is advanced at different parts of the upper surface of the substrate W, and the evaporation of the organic solvent liquid is advanced at different parts of the upper surface of the substrate W. Therefore, it is possible to completely spin off the organic solvent liquid from the upper surface of the substrate W by the high-speed rotation of the substrate W.

Additionally, the advancement of the evaporation of the organic solvent liquid that enters the inside of the pattern P is accelerated in response to the supply of a high-temperature inert gas to the upper surface of the substrate W. This makes it possible to shorten a period of time required to remove the organic solvent liquid from the inside of the pattern P. It is possible to dry the upper surface of the substrate W at once by simultaneously performing the supply of a high-temperature inert gas and the opening of the internal space 7 of the seal chamber 6. As a result of the at-once drying of the upper surface of the substrate W, it is possible to restrict an impulse applied to the pattern P to a small level, and hence is possible to restrain the pattern P from being collapsed.

Figure 8A:
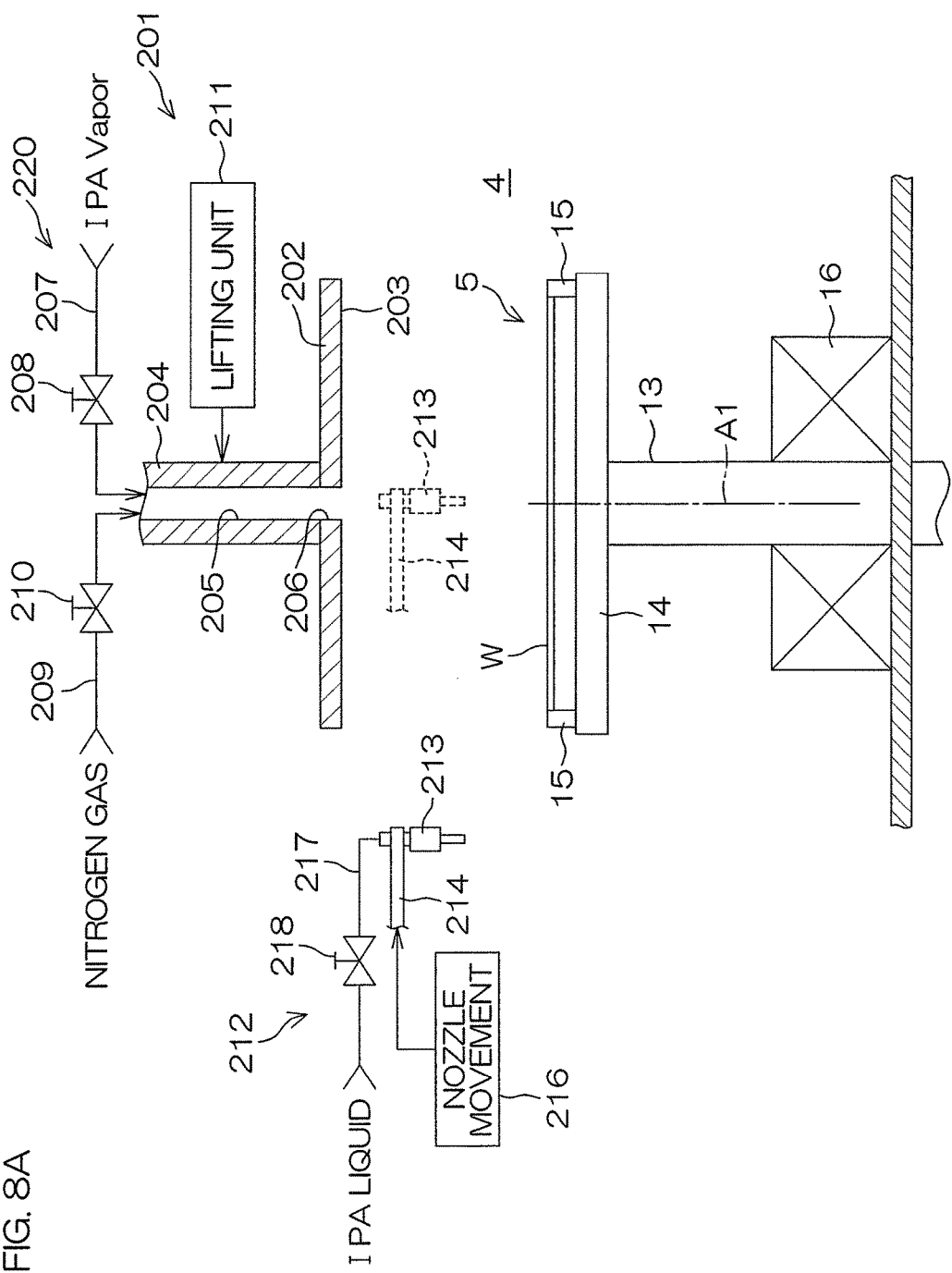
FIG. 8A is a view that schematically shows a substrate processing apparatus according to a second preferred embodiment of the present invention.
Figure 8B:
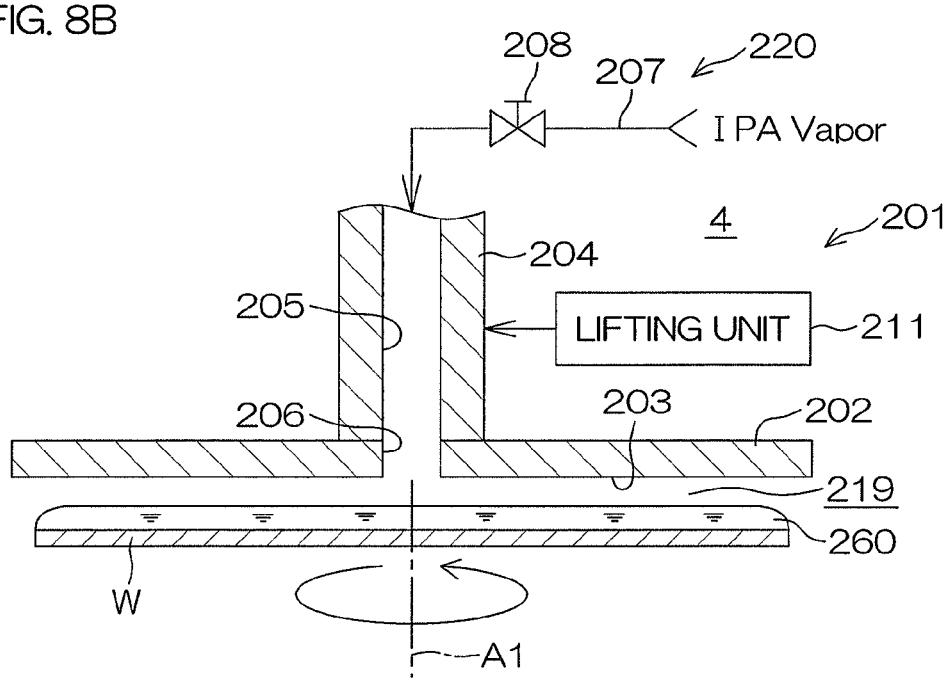
FIG. 8B to FIG. 8D are cross-sectional views schematically to describe the situation of each step of substrate processing performed by the substrate processing apparatus.
Figure 8C:
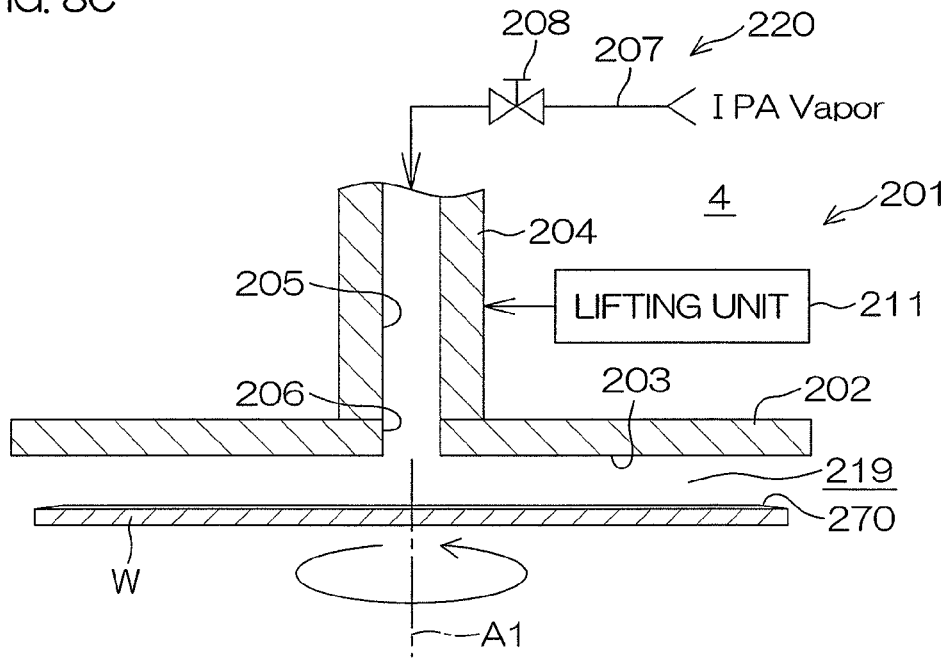
Figure 8D:
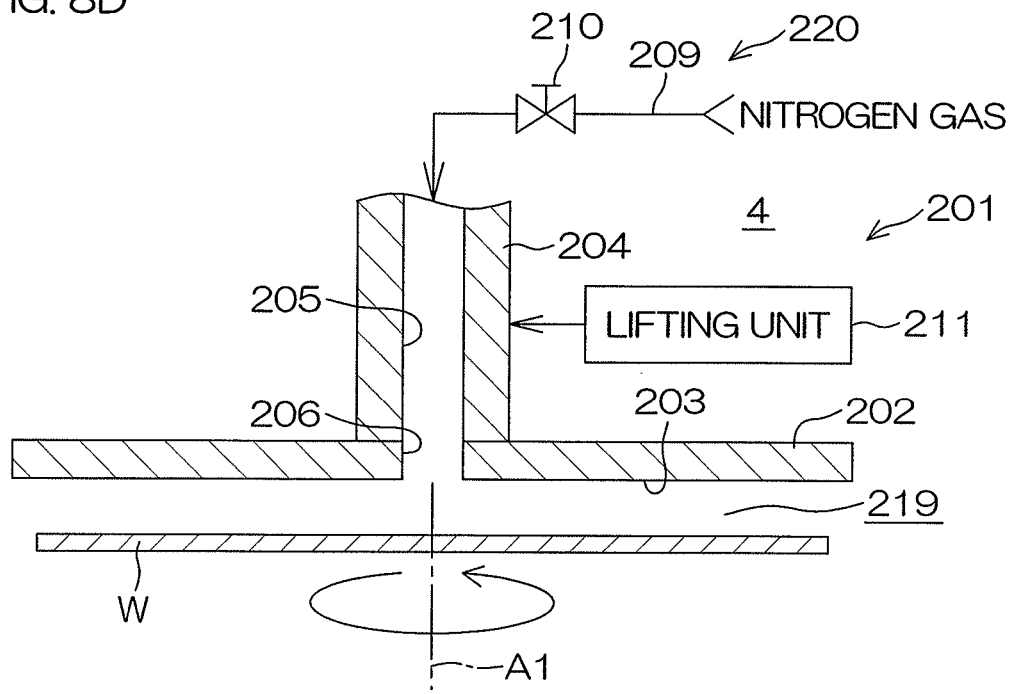
Figure 9:
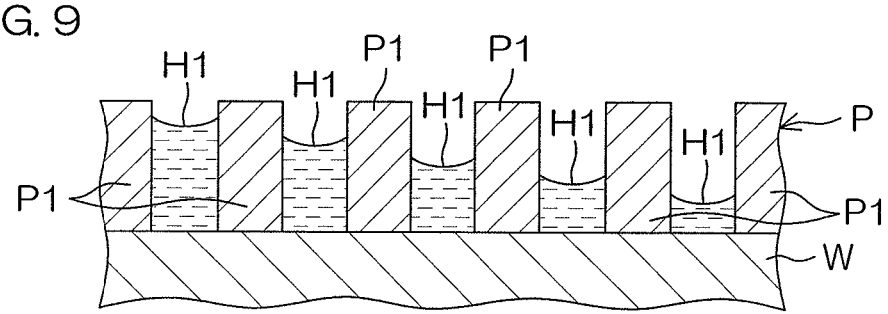
FIG. 9 is a view to describe a pattern-collapsing mechanism.

FIG. 8A is a view schematically to describe an arrangement of a substrate processing apparatus 201 according to a second preferred embodiment of the present invention. FIG. 8B and FIG. 8C are cross-sectional views schematically to describe a situation of the organic solvent thin-film holding step T3 of substrate processing performed by the substrate processing apparatus 201. FIG. 8D is a cross-sectional view schematically to describe a situation of the spin drying step T4 of substrate processing performed by the substrate processing apparatus 201.

In the second preferred embodiment, the same reference sign as in FIGS. 1 to 7C is given to a component equivalent to that in the first preferred embodiment, and a description of this component is omitted. A main point in which the substrate processing apparatus 201 according to the second preferred embodiment differs from the substrate processing apparatus 1 according to the first preferred embodiment is that the seal chamber 6 is not disposed in the processing chamber 4 and that a facing member 202 that faces the upper surface of the substrate W held by the spin chuck 5 is disposed in the processing chamber 4.

The facing member 202 has a disk shape. The diameter of the facing member 202 is equal to or is larger than that of the substrate W. A circular facing surface 203 that is flat and that faces the upper surface of the substrate W held by the spin chuck 5 is formed on the undersurface of the facing member 202. The facing surface 203 faces the whole area of the upper surface of the substrate W. The facing member 202 is supported by a holder 204 in a horizontal posture such that the central axis of the facing member 202 is positioned on the rotational axis A1 of the spin chuck 5.

The holder 204, which allows a vertical axis passing through the center of the facing member 202 (i.e., a vertical axis that coincides with the rotational axis A1 of the spin chuck 5) to serve as its central axis, is fixed to the upper surface of the facing member 202. The holder 204 is formed in a hollow shape, and a gas supply path 205 is formed so as to pass through the inside of the holder 204 in a state of extending in the vertical direction. The gas supply path 205 is opened in the facing surface 203 so as to form a discharge port 206.

An organic solvent vapor pipe 207 is connected to the gas supply path 205. An organic solvent vapor, such as an IPA vapor, is supplied to the organic solvent vapor pipe 207 from an organic solvent vapor supply source. An organic solvent vapor valve 208 to open and close the organic solvent vapor pipe 207 is interposed in the organic solvent vapor pipe 207. In the present preferred embodiment, an organic solvent vapor supply unit 220 is composed of the gas supply path 205, the organic solvent vapor pipe 207, and the organic solvent vapor valve 208. When the organic solvent vapor valve 208 is opened, the organic solvent vapor supplied to the gas supply path 205 from the organic solvent vapor pipe 207 is discharged downwardly from the discharge port 206.

A second inert gas pipe 209 is connected to the gas supply path 205. A high-temperature inert gas, such as a high-temperature nitrogen gas (higher than a room temperature: e.g., 20 to 300° C.), is supplied to the second inert gas pipe 209 from a high-temperature inert gas supply source. A second inert gas valve 210 to open and close the second inert gas pipe 209 is interposed in the second inert gas pipe 209. When the second inert gas valve 210 is opened, the organic solvent vapor supplied to the gas supply path 205 from the second inert gas pipe 209 is discharged downwardly from the discharge port 206.

An lifting unit 211 is connected to the controller 3 (see FIG. 2 and soon). The controller 3 controls the lifting unit 211 and allows the lifting unit 211 to move up and down between an approach position at which the facing surface 203 of the facing member 202 approaches the upper surface of the substrate W held by the spin chuck 5 and a retreat position at which the facing surface 203 greatly retreats upwardly from the spin chuck 5. When the facing member 202 is situated at the approach position, the discharge port 206 faces the upper surface of the substrate W with a predetermined interval W3 (see FIG. 8B: e.g., about 5 mm) therebetween.

The substrate processing apparatus 201 additionally includes a second organic solvent supply unit 212 to supply an organic solvent liquid that has surface tension lower than water on the upper surface of the substrate W held by the spin chuck 5. The second organic solvent supply unit 212 is a unit disposed instead of the first organic solvent supply unit 11 (see FIG. 2) according to the first preferred embodiment.

An arrangement (not shown in FIG. 8A), which is equivalent to the chemical liquid supply unit 9 (see FIG. 2), the rinsing liquid supply unit 10 (see FIG. 2), and the inert gas supply unit 12 (see FIG. 2), is disposed in the processing chamber 4.

The second organic solvent supply unit 212 includes a second organic solvent nozzle 213 that discharges an organic solvent liquid toward the front surface of the substrate W, a nozzle arm 214 having a forward end to which the second organic solvent nozzle 213 is attached, an arm support shaft (not shown) that extends in the vertical direction beside the spin chuck 5 and that swingably supports the nozzle arm 214, and a nozzle moving unit 216 that moves the second organic solvent nozzle 213 by rotating the arm support shaft and by moving the nozzle arm 214. The second organic solvent nozzle 213 is, for example, a straight nozzle that discharges IPA in a continuous flow state, and is attached to the nozzle arm 214 extending in a horizontal direction in a state in which its discharge port is directed, for example, downwardly. The nozzle arm 214 extends in the horizontal direction.

The second organic solvent supply unit 212 includes a second organic solvent pipe 217 that guides an organic solvent liquid to the second organic solvent nozzle 213 and a second organic solvent valve 218 that opens and closes the second organic solvent pipe 217. When the second organic solvent valve 218 is opened, an IPA liquid from an IPA supply source is supplied to the second organic solvent nozzle 213 from the second organic solvent pipe 217. Accordingly, the IPA liquid is discharged from the second organic solvent nozzle 213.

The nozzle moving unit 216 horizontally moves the second organic solvent nozzle 213 by turning the nozzle arm 214 around the arm support shaft. The nozzle moving unit 216 horizontally moves the second organic solvent nozzle 213 between a processing position at which IPA discharged from the second organic solvent nozzle 213 adheres to the upper surface of the substrate W and a home position at which the second organic solvent nozzle 213 is set around the spin chuck 5 when viewed planarly. The second organic solvent nozzle 213 may be a stationary nozzle having its discharge port that is fixedly disposed so as to be directed toward a predetermined position (for example, the middle) of the upper surface of the substrate W.

The controller 3 controls the operations of the lifting unit 211, the electric motor 16, the nozzle moving unit 216, etc., in accordance with a predetermined program. Additionally, the controller 3 controls the open-close operations of the chemical liquid valve 32, the rinsing liquid valve 35, the second organic solvent valve 218, the organic solvent vapor valve 208, the second inert gas valve 210, the drainage valve 43, the exhaust valve 47, etc.

In the substrate processing apparatus 201 according to the second preferred embodiment, processing equivalent to the aforementioned substrate processing (see FIG. 4 and FIGS. 5A to 5G) is performed.

Specifically, an unprocessed substrate W is carried into the processing unit 2, and is carried into the processing chamber 4. When the substrate W is carried thereinto, the facing member 202 is situated at the retreat position. After the substrate W is carried thereinto, chemical liquid treatment (S2 of FIG. 4) and rinsing (S3 of FIG. 4) are successively performed. After performing the rinsing, organic solvent processing (S4 of FIG. 4) is performed in which a rinsing liquid on the substrate W is replaced with an organic solvent liquid that is a low surface-tension liquid having lower surface tension. The controller 3 moves the second organic solvent nozzle 213 from the home position to the processing position (shown by the broken line in FIG. 8A) by controlling the nozzle moving unit 216. As a result, the second organic solvent nozzle 213 is disposed above the middle of the substrate W.

The organic solvent processing includes an organic solvent replacing step (liquid film forming step) T1 (see FIG. 6), an organic solvent puddling step (liquid film forming step) T2 (see FIG. 6), and an organic solvent thin-film holding step (thin film holding step) T3 (see FIG. 6), and these steps are performed in this order in the same way as in the first preferred embodiment.

As shown in FIG. 8A, in the organic solvent replacing step T1, the controller 3 opens the second organic solvent valve 218, and supplies an organic solvent liquid to the upper surface of the substrate W from the second organic solvent nozzle 213. The organic solvent supplied to the upper surface of the substrate W receives a centrifugal force and proceeds outwardly from the center of the upper surface of the substrate W, and forms a liquid film of the organic solvent with which the upper surface of the substrate W is covered. A rinsing liquid supplied to the upper surface of the substrate W in rinsing (S3 of FIG. 4) is all replaced with an organic solvent liquid by covering the whole area of the upper surface of the substrate W with the liquid film of the organic solvent.

The organic solvent puddling step T2 is a step in which the rotation of the substrate W is decreased to be kept at a puddle speed (e.g., 10 rpm), and a thick liquid film 260 of the organic solvent is formed and held on the upper surface of the substrate W. The whole area of the upper surface of the substrate W is covered with the liquid film 260. Deceleration to the puddle speed is stepwisely performed in the same way as in the first preferred embodiment. After the thick liquid film 260 of the organic solvent is formed, the discharge of the organic solvent liquid from the second organic solvent nozzle 213 is stopped.

After the discharge of the organic solvent liquid is stopped, the controller 3 controls the nozzle moving unit 216 and returns the second organic solvent nozzle 213 to the home position. Furthermore, the controller 3 controls the lifting unit 211 and lowers the facing member 202, and situates the facing member 202 at the approach position as shown in FIG. 8B. After the facing member 202 is situated at the approach position, the controller 3 opens the organic solvent vapor valve 208. As a result, an organic solvent vapor is supplied to the discharge port 206 through the organic solvent vapor pipe 207, and is discharged downwardly from the discharge port 206. Accordingly, the organic solvent vapor is supplied to a space 219 between the facing surface 203 and the substrate W (hereinafter, referred to simply as the "space 219"). The supply flow rate of the organic solvent vapor at this time is, for example, 1 (liter/min) or more. As a result, the space 219 is filled with the organic solvent vapor. In other words, the surroundings of the entire upper surface of the substrate W are kept in a state in which the organic solvent vapor is rich.

An organic solvent vapor pipe 207 is connected to the gas supply path 205. An organic solvent vapor valve 208 is interposed in the organic solvent vapor pipe 207. When the organic solvent vapor valve 208 is opened, the organic solvent vapor supplied to the gas supply path 205 from the organic solvent vapor pipe 207 is discharged downwardly from the discharge port 206.

After a sufficient period of time to fill the space 219 with the organic solvent vapor elapses, the organic solvent thin-film holding step T3 is performed.

In the organic solvent thin-film holding step T3, as shown in FIG. 8B, the controller 3 forms the thick liquid film 260 of the organic solvent on the upper surface of the substrate W, and then rotates the substrate W at a high speed (about 1200 rpm) while keeping the surroundings of the entire upper surface thereof in a state in which the organic solvent vapor is rich. Most of the organic solvent liquid on the upper surface of the substrate W is spun off by the high-speed rotation of the substrate W. Therefore, most of the organic solvent liquid included in the thick liquid film 260 of the organic solvent is discharged outwardly from the substrate W, and the liquid film 260 of the organic solvent is thinned. However, the surroundings of the entire upper surface of the substrate W are kept in a state in which the organic solvent vapor is rich, and therefore the diffusion of the organic solvent vapor is not advanced in the upper surface of the substrate W, and, as a result, the evaporation of the organic solvent liquid is restrained or prevented from being advanced in the upper surface of the substrate W. Therefore, it is impossible to remove all of the organic solvent liquid forming the thick liquid film 260 of the organic solvent. Accordingly, as shown in FIG. 8C, a thin film 270 (e.g., about 1 μm) of the organic solvent with which the whole area of the upper surface of the substrate W is covered is formed on the upper surface of the substrate W. When a predetermined period of time elapses from the start of the supply of the organic solvent vapor, the controller 3 closes the organic solvent vapor valve 208. In accordance with a lapse in time, the atmosphere in the space 219 is rapidly replaced with air from the organic solvent vapor by stopping supplying the organic solvent vapor.

Following the organic solvent thin-film holding step T3, a spin drying step T4 (thin-film removing step: see FIG. 6) is performed. Specifically, the controller 3 opens the second inert gas valve 210 while keeping the rotation of the substrate W at a high rotational speed (about 1200 rpm). As a result, a high-temperature inert gas is sprayed onto the middle of the upper surface of the substrate W from the discharge port 206.

In the spin drying step T4, the atmosphere of the space 219 is in an air or nitrogen gas state or in a mixed state of air and nitrogen gas. In that state, the substrate W is rotated at a high rotational speed (about 1200 rpm). Therefore, a fresh gas (air, nitrogen gas, or mixed gas of air and nitrogen gas) comes into contact with the upper surface of the substrate W, and therefore the diffusion of the organic solvent vapor is advanced at different parts of the upper surface of the substrate W, and the evaporation of the organic solvent liquid is advanced at different parts of the upper surface of the substrate W. As a result of the high-speed rotation of the substrate W, the organic solvent liquid adhering to the upper surface of the substrate W is completely spun off toward the surroundings of the substrate W, and the evaporation of the organic solvent liquid is advanced in the upper surface of the substrate W. Accordingly, the thin film 270 of the organic solvent is completely removed from the upper surface of the substrate W.

Additionally, in the spin drying step T4, the substrate W is rotated at a high speed while supplying a high-temperature inert gas to the upper surface of the substrate W as shown in FIG. 8D. In response to the supply of the high-temperature inert gas to the upper surface of the substrate W, the advancement of the evaporation of the organic solvent liquid that has entered the inside of the pattern P is accelerated.

After finishing the spin drying step T4, the rotation of the spin chuck 5 is stopped, and the second inert gas valve 210 is closed, and the discharge of the inert gas from the discharge port 206 is stopped. Furthermore, the facing member 202 is raised toward the retreat position. Thereafter, the controller 3 allows a processed substrate W to be carried out from the processing unit 2 by means of the transfer robot CR.

As described above, according to this second preferred embodiment, the liquid film 260 of the organic solvent with which the whole area of the upper surface of the substrate W is covered is formed on the upper surface of the substrate W, and then the substrate W is rotated at a high speed while keeping the surroundings of the entire upper surface of the substrate W in a state in which the organic solvent vapor is rich. Most of the organic solvent liquid on the upper surface of the substrate W is spun off by the high-speed rotation of the substrate W. Therefore, most of the organic solvent liquid included in the liquid film of the organic solvent is discharged outwardly from the substrate W, and the liquid film 260 of the organic solvent is thinned. However, the surroundings of the entire upper surface of the substrate W are kept in a state in which the organic solvent vapor is rich, and therefore the diffusion of the organic solvent vapor is not advanced in the upper surface of the substrate W, and, as a result, the evaporation of the organic solvent liquid is restrained or prevented from being advanced in the upper surface of the substrate W. This makes it impossible to remove all of the organic solvent liquid forming the liquid film 260 of the organic solvent, and the thin film 270 of the organic solvent with which the whole area of the upper surface of the substrate W is covered is held on the upper surface of the substrate W.

Additionally, the surroundings of the entire upper surface of the substrate W are kept in a state in which the organic solvent vapor is rich, and therefore the diffusion of the organic solvent vapor is restrained from being advanced in the whole area of the upper surface of the substrate W, and, as a result, it is possible to keep the thin film 270 of the organic solvent uniform in thickness in the whole area of the upper surface of the substrate W. Thereafter, the thin film 270 of the organic solvent is removed from the upper surface of the substrate W. In other words, the organic solvent liquid is removed from between patterns P.

The liquid film 260 of the organic solvent is temporarily thinned so as to be the thin film 270 having a uniform, small thickness, and then the removal of the organic solvent liquid is started, and therefore it is possible to remove the organic solvent liquid from the upper surface of the substrate W while maintaining a state in which the liquid surface height of the organic solvent between patterns P does not vary at different parts of the upper surface of the substrate W. Therefore, it is possible to maintain the balance of surface tension (capillary force) generated in each pattern P when the organic solvent liquid is removed. This makes it possible to restrain or prevent the pattern P from being collapsed.

Additionally, although the space 219 is to be opened outwardly, the organic solvent vapor continues to be supplied to the space 219, and, as a result, it becomes possible to bring the substantially whole area of the internal space 219 containing the substrate W into a state in which the organic solvent vapor is rich. Therefore, it is possible to reliably keep the surroundings of the entire upper surface of the substrate W in a state in which the organic solvent vapor is rich. Accordingly, in the organic solvent thin-film holding step T3, it is possible to reliably stop the evaporation of the organic solvent liquid in the upper surface of the substrate W (i.e., the diffusion of the organic solvent vapor in the upper surface of the substrate W), and hence is possible to reliably form the thin film 270 of the organic solvent that has a uniform, small thickness on the upper surface of the substrate W.

Additionally, in the spin drying step T4, after the supply of the organic solvent vapor to the space 219 is stopped, the high-speed rotation of the substrate W is started. In the open state of the space 219, a fresh gas comes into contact with the upper surface of the substrate W, and therefore the diffusion of the organic solvent vapor is advanced at different parts of the upper surface of the substrate W, and the evaporation of the organic solvent liquid is advanced at different parts of the upper surface of the substrate W. Therefore, it is possible to completely spin off the organic solvent liquid from the upper surface of the substrate W by the high-speed rotation of the substrate W. This makes it possible to dry the upper surface of the substrate W.

Additionally, in the spin drying step T4, a high-temperature inert gas is supplied to the upper surface of the substrate W. The advancement of the evaporation of the organic solvent liquid that enters the inside of the pattern P is accelerated in response to the supply of the high-temperature inert gas to the upper surface of the substrate W. This makes it possible to shorten a period of time required to remove the organic solvent liquid from the inside of the pattern P. As a result of shortening a period of time required to remove the organic solvent liquid, it is possible to restrict an impulse applied to the pattern P to a small level, and hence is possible to restrain the pattern P from being collapsed. Therefore, the supply of a high-temperature inert gas to the upper surface of the substrate W makes it possible to further prevent the pattern P from being collapsed.

Although the two preferred embodiments of the present invention have been described as above, the present invention can be practiced with other preferred embodiment.

As described in the first preferred embodiment, the chamber body 18 of the seal chamber 6 is formed in a cylindrical shape, and yet it may be formed in another shape (for example, angularly cylindrical shape) without being limited to the cylindrical shape.

Additionally, as described in the first preferred embodiment, the chemical liquid nozzle 30, the rinsing liquid nozzle 33, the first organic solvent nozzle 36, and the inert gas nozzle 39 extend so as to pass through the center portion of the lid member 19 of the seal chamber 6, and yet a common nozzle may be allowed to pass through the center portion of the lid member 19 of the seal chamber 6, and the common nozzle may be connected to the chemical liquid pipe 31, to the rinsing liquid pipe 34, to the first organic solvent pipe 37, and to the first inert gas pipe 40. In this case, a chemical liquid is discharged from the common nozzle by opening the chemical liquid valve 32 while closing the rinsing liquid valve 35, the first organic solvent valve 38, and the second inert gas valve 210. A rinsing liquid is discharged from the common nozzle by opening the rinsing liquid valve 35 while closing the chemical liquid valve 32, the first organic solvent valve 38, and the second inert gas valve 210. An organic solvent liquid is discharged from the common nozzle by opening the first organic solvent valve 38 while closing the chemical liquid valve 32, the rinsing liquid valve 35, and the second inert gas valve 210. An inert gas is discharged from the common nozzle by opening the second inert gas valve 210 while closing the chemical liquid valve 32, the rinsing liquid valve 35, and the first organic solvent valve 38.

Additionally, in the first preferred embodiment, the chemical liquid nozzle 30 and/or the rinsing liquid nozzle 33 may be disposed outside the seal chamber 6 without employing an arrangement in which its discharge port faces the internal space 7 of the seal chamber 6. In this case, the chemical liquid nozzle 30 and/or the rinsing liquid nozzle 33 are/is not required to be disposed fixedly with respect to the spin chuck 5, and, for example, a so-called scanning nozzle type may be employed in which the chemical liquid nozzle 30 and/or the rinsing liquid nozzle 33 are/is attached to an arm swingable in a horizontal plane above the spin chuck 5 and in which the adhesion position of a chemical liquid in an upper surface of a substrate W is scanned by the swing of the arm.

Additionally, in the first preferred embodiment, an air supply unit may be separately disposed to supply clean air or the like into the seal chamber 6 so that the depressurized state of the seal chamber 6 being in a closed state is controlled. Additionally, the depressurized state of the seal chamber 6 being in a closed state may be controlled by supplying an inert gas from the inert gas nozzle 39.

As described in the organic solvent thin-film holding step T3 of the first preferred embodiment, an organic solvent liquid supplied to the upper surface of a substrate in the organic solvent replacing step T1 is evaporated, and by use of an organic solvent vapor generated by the evaporation of the organic solvent liquid, the surroundings of the entire upper surface of the substrate W are kept in a state in which the organic solvent vapor is rich. However, in the first preferred embodiment, the surroundings of the entire upper surface of the substrate may be kept in a state in which an organic solvent vapor is rich by supplying the organic solvent vapor from the organic solvent vapor nozzle in the same way as in the second preferred embodiment.

Additionally, as described in the first preferred embodiment, the internal space 7 of the seal chamber 6 is brought into an open state by opening the exhaust valve 47 prior to the spin drying step T4, and yet the internal space 7 of the seal chamber 6 may be brought into an open state by separating the lid member 19 from the chamber body 18 while controlling the lid member lifting unit 27.

Additionally, as described in the first preferred embodiment, the supply of the organic solvent liquid from the first organic solvent nozzle 36 is stopped when the rotation speed of the substrate W reaches a puddle rotation speed, and yet the organic solvent liquid may continue being supplied after the rotation speed of the substrate W reaches the puddle rotation speed.

Additionally, as described in the second preferred embodiment, the supply of the organic solvent vapor is started after the rotation speed of the substrate W reaches the puddle rotation speed, and yet the supply thereof may be started before the rotation speed of the substrate W reaches the puddle rotation speed (for example, at a predetermined timing after the facing member 202 is situated at the approach position).

As described in the spin drying step T4 of each of the aforementioned preferred embodiments, the upper surface of the substrate W is brought into the atmosphere of clean air while simultaneously supplying a high-temperature inert gas to the upper surface of the substrate W. However, without supplying a high-temperature inert gas, the substrate W may be rotated at a high speed in a state in which the upper surface of the substrate W is in the atmosphere of clean air.

Additionally, however, a high-temperature inert gas may be supplied while keeping the upper surface of the substrate in a state of an organic solvent vapor, and the substrate W may be rotated at a high speed in that state.

As described in each of the aforementioned preferred embodiments, the rotation speed (second high rotational speed) of the substrate W in the spin drying step T4 is equal to the rotation speed (first high rotational speed) of the substrate W in the organic solvent thin-film holding step T3, and yet the rotation speed (second high rotational speed) of the substrate W in the spin drying step T4 can be made higher (e.g., about 1400 rpm) than the rotation speed (first high rotational speed) of the substrate W in the organic solvent thin-film holding step T3. In this case, the upper surface of the substrate W can be dried at once more quickly.

Additionally, as described in each of the aforementioned preferred embodiments, organic solvent processing includes the organic solvent replacing step T1, the organic solvent puddling step T2, and the organic solvent thin-film holding step T3, and yet either one of the organic solvent replacing step T1 and the organic solvent puddling step T2 may be excluded.

Additionally, in the organic solvent replacing step T1 of each of the aforementioned preferred embodiments, an organic solvent liquid that has a liquid temperature (e.g., 40 to 50° C.) higher than a room temperature may be supplied to the upper surface of the substrate W. In this case, the liquid temperature of the organic solvent liquid supplied to the upper surface of the substrate W is high, and therefore a thin film of the organic solvent that has been thinned also has a high liquid temperature. Therefore, the thin films 70 and 270 of the organic solvent have a high liquid temperature, and therefore the evaporation speed of the organic solvent liquid that has entered a gap of the inside of the pattern P is high, and therefore it is possible to shorten a period of drying time. This makes it possible to further prevent the pattern P from being collapsed.

Additionally, methanol, ethanol, acetone, and HEF (hydrofluoroether), in addition to IPA, can be mentioned as a usable organic solvent. Any of these liquids is an organic solvent that is smaller in surface tension than water (DIW).

Although the preferred embodiments of the present invention have been described in detail, these embodiments are merely concrete examples used to clarify the technical contents of the present invention, and the present invention should not be understood by being limited to these concrete examples, and the scope of the present invention is limited solely by the appended claims.

The present application corresponds to Japanese Patent Application No. 2015-117557 filed in the Japan Patent Office on Jun. 10, 2015, and the entire disclosure of the application is incorporated herein by reference.

What is claimed is:

1. A substrate processing method comprising:
a substrate holding step of holding a substrate horizontally by a substrate holding unit, the substrate having an upper surface on which a pattern is formed;
a liquid film forming step of forming a liquid film of an organic solvent with which a whole area of the upper surface of the substrate is covered in order to replace a processing liquid existing on the upper surface of the substrate with an organic solvent liquid;
a thin film holding step of thinning the liquid film of the organic solvent by rotating the substrate at a first rotational speed while keeping surroundings of the whole area of an upper surface of the liquid film of the organic solvent in an atmosphere of an organic solvent vapor and holding a resulting thin film of the organic solvent on the upper surface of the substrate; and
a thin-film removing step of removing the thin film from the upper surface of the substrate after the thin film holding step,
the thin-film removing step including a rotation step of rotating the substrate at a second rotational speed.

2. The substrate processing method according to claim 1, wherein the substrate holding unit is accommodated in an internal space of a seal chamber that is sealed up from an outside, and
the thin film holding step is performed in a closed state in which the internal space is sealed up from the outside.

3. The substrate processing method according to claim 2, wherein the thin film holding step is performed in a state of closing an exhaust valve by which the internal space of the seal chamber is exhausted.

4. The substrate processing method according to claim 2, wherein the thin-film removing step further includes an opening step of opening the internal space of the seal chamber to the outside.

5. The substrate processing method according to claim 4, wherein the thin-film removing step further includes a step of supplying a high-temperature inert gas higher than a room temperature toward the upper surface of the substrate and opening the internal space of the seal chamber to the outside.

6. The substrate processing method according claim 1, wherein the thin-film removing step further includes an inert gas supply step of supplying a high-temperature inert gas higher than a room temperature toward the upper surface of the substrate.

7. The substrate processing method according to claim 1, wherein the thin film holding step keeps the surroundings of the upper surface of the liquid film of the organic solvent in an atmosphere of the organic solvent vapor by use of the organic solvent vapor generated by evaporation of the organic solvent liquid supplied to the upper surface of the substrate the liquid film forming step.

8. The substrate processing method according to claim 7, wherein the liquid film forming step includes a high-temperature organic solvent supply step of supplying the organic solvent liquid having a liquid temperature higher than a room temperature to the upper surface of the substrate.

9. The substrate processing method according to claim 1, wherein the second rotational speed is higher than the first rotational speed.

10. The substrate processing method according to claim 1, wherein the thin film holding step of thinning the liquid film of the organic solvent includes a step of supplying a vapor of the organic solvent to a space toward which the upper surface of the liquid film of the organic solvent faces.

* * * * *